US007460206B2

(12) United States Patent
Weissenrieder et al.

(10) Patent No.: US 7,460,206 B2
(45) Date of Patent: Dec. 2, 2008

(54) PROJECTION OBJECTIVE FOR IMMERSION LITHOGRAPHY

(75) Inventors: Karl-Stefan Weissenrieder, Aalen (DE); Alexander Hirnet, Ellwangen (DE); Alexandra Pazidis, Aalen (DE); Karl-Heinz Schuster, Koenigsbronn (DE); Christoph Zaczek, Heubach (DE); Michael Lill, Aalen (DE); Patrick Scheible, deceased, late of Aalen (DE); by Guenter Scheible, legal representative, Stuttgart (DE); Harald Schink, Aalen (DE); Markus Brotsack, Aalen (DE); Ulrich Loering, Oberkochen (DE); Toralf Gruner, Aalen-Hofen (DE)

(73) Assignee: Carl Zeiss SMT AG, Oberkochen (DE)

( * ) Notice: Subject to any disclaimer, the term of this patent is extended or adjusted under 35 U.S.C. 154(b) by 125 days.

(21) Appl. No.: 11/015,553

(22) Filed: Dec. 20, 2004

(65) Prior Publication Data

US 2005/0225737 A1    Oct. 13, 2005

Related U.S. Application Data

(60) Provisional application No. 60/612,823, filed on Sep. 24, 2004, provisional application No. 60/592,208, filed on Jul. 29, 2004, provisional application No. 60/591,775, filed on Jul. 27, 2004, provisional application No. 60/568,006, filed on May 4, 2004, provisional application No. 60/544,967, filed on Feb. 13, 2004, provisional application No. 60/530,978, filed on Dec. 22, 2003, provisional application No. 60/530,623, filed on Dec. 19, 2003.

(30) Foreign Application Priority Data

Oct. 22, 2004    (DE)    .................. 10 2004 051 730

(51) Int. Cl.
*G03B 27/52* (2006.01)
*G03B 27/54* (2006.01)
(52) U.S. Cl. .......................................... 355/30; 355/67
(58) Field of Classification Search .................. 355/30, 355/52, 55, 53, 67–69; 359/350, 355, 509, 359/512
See application file for complete search history.

(56) References Cited

U.S. PATENT DOCUMENTS 3,573,975 A    4/1971    Dhaka et al.

(Continued)

FOREIGN PATENT DOCUMENTS

DE    206 607    2/1984

(Continued)

OTHER PUBLICATIONS

U.S. Appl. No. 60/632,550, filed Dec. 1, 2004, Weippert et al (translation enclosed).

(Continued)

*Primary Examiner*—Hung Henry Nguyen
(74) *Attorney, Agent, or Firm*—Fish & Richardson P.C.

(57) ABSTRACT

In a projection objective provided for imaging a pattern arranged in an object plane of the projection objective into an image plane of the projection objective with the aid of an immersion medium arranged between a last optical element of the projection objective in the light path and the image plane, the last optical element has a transparent substrate and a protective layer system that is fitted to the substrate, is provided for contact with the immersion medium and serves for increasing the resistance of the last optical element to degradation caused by the immersion medium.

3 Claims, 9 Drawing Sheets

U.S. PATENT DOCUMENTS

| | | |
|---|---|---|
| 3,648,587 A | 3/1972 | Stevens |
| 3,706,485 A | 12/1972 | Fawcett et al. |
| 4,269,125 A | 5/1981 | Mellinger |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,500,611 A | 2/1985 | Nickol et al. |
| 4,509,852 A | 4/1985 | Tabarelli et al. |
| 4,568,140 A | 2/1986 | Van der Werf et al. |
| 5,040,020 A | 8/1991 | Rauschenbach et al. |
| 5,067,781 A | 11/1991 | Montanari et al. |
| 5,121,256 A | 6/1992 | Corie et al. |
| 5,139,879 A | 8/1992 | Aharoni et al. |
| 5,494,743 A | 2/1996 | Woodard et al. |
| 5,610,683 A | 3/1997 | Takahashi |
| 5,648,860 A | 7/1997 | Ooi et al. |
| 5,673,103 A | 9/1997 | Inoue et al. |
| 5,715,039 A | 2/1998 | Fukuda et al. |
| 5,724,185 A | 3/1998 | Hickey et al. |
| 5,825,043 A | 10/1998 | Suwa |
| 5,882,773 A | 3/1999 | Chow et al. |
| 5,900,354 A | 5/1999 | Batchelder |
| 5,962,079 A | 10/1999 | Koberstein et al. |
| 5,993,898 A | 11/1999 | Nagatsuka |
| 6,084,846 A | 7/2000 | Jordache et al. |
| 6,166,855 A | 12/2000 | Ikeyama et al. |
| 6,191,429 B1 | 2/2001 | Suwa |
| 6,236,634 B1 | 5/2001 | Lee et al. |
| 6,404,482 B1 | 6/2002 | Shiraishi |
| 6,417,974 B1 | 7/2002 | Schuster |
| 6,466,365 B1 | 10/2002 | Maier et al. |
| 6,479,999 B1 | 11/2002 | DeMeester et al. |
| 6,556,353 B2 | 4/2003 | Omura |
| 6,560,032 B2 | 5/2003 | Hatano |
| 6,563,565 B2 | 5/2003 | Nishi |
| 6,574,039 B1 | 6/2003 | Murata et al. |
| 6,600,547 B2 | 7/2003 | Watson et al. |
| 6,603,130 B1 | 8/2003 | Bisschops et al. |
| 6,628,574 B1 | 9/2003 | Shimazaki et al. |
| 6,633,365 B2 | 10/2003 | Suenaga |
| 6,697,199 B2 | 2/2004 | Gerhard et al. |
| 6,724,462 B1 * | 4/2004 | Singh et al. ............... 355/53 |
| 6,788,477 B2 | 9/2004 | Lin |
| 6,833,949 B2 | 12/2004 | Maier et al. |
| 6,891,596 B2 | 5/2005 | Rostalski et al. |
| 6,903,395 B2 * | 6/2005 | Nakai et al. ............... 257/294 |
| 6,992,750 B2 | 1/2006 | Kawashima et al. |
| 7,029,832 B2 * | 4/2006 | Rolland et al. ............. 430/322 |
| 7,046,337 B2 | 5/2006 | Kawashima et al. |
| 7,092,069 B2 * | 8/2006 | Schuster .................... 355/53 |
| 7,126,667 B2 | 10/2006 | Kawashima et al. |
| 7,129,009 B2 | 10/2006 | French et al. |
| 7,187,503 B2 | 3/2007 | Rostalski et al. |
| 2001/0019404 A1 * | 9/2001 | Schuster et al. ............. 355/67 |
| 2002/0008861 A1 | 1/2002 | Singer et al. |
| 2002/0020821 A1 | 2/2002 | Van Santen et al. |
| 2002/0163626 A1 | 11/2002 | Switkes et al. |
| 2002/0167740 A1 | 11/2002 | Osterried et al. |
| 2003/0011896 A1 | 1/2003 | Shiraishi |
| 2003/0021015 A1 | 1/2003 | Maier et al. |
| 2003/0123040 A1 | 7/2003 | Almogy |
| 2003/0137733 A1 | 7/2003 | Gerhard et al. |
| 2003/0142409 A1 | 7/2003 | Ohtsu et al. |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0021930 A1 | 2/2004 | Pfieffer et al. |
| 2004/0057036 A1 | 3/2004 | Kawashima et al. |
| 2004/0075895 A1 | 4/2004 | Lin |
| 2004/0105170 A1 | 6/2004 | Krahmer et al. |
| 2004/0109237 A1 | 6/2004 | Epple et al. |
| 2004/0114117 A1 | 6/2004 | Bleeker |
| 2004/0119954 A1 | 6/2004 | Kawashima et al. |
| 2004/0125351 A1 | 7/2004 | Krautschik et al. |
| 2004/0150806 A1 | 8/2004 | Brunotte et al. |
| 2004/0165159 A1 | 8/2004 | Lof et al. |
| 2005/0007567 A1 | 1/2005 | Pierrat et al. |
| 2005/0036183 A1 * | 2/2005 | Yeo et al. ................. 359/15 |
| 2005/0068499 A1 | 3/2005 | Dodoc et al. |
| 2005/0094119 A1 | 5/2005 | Loopstra et al. |
| 2005/0100745 A1 * | 5/2005 | Lin et al. .................. 428/446 |
| 2005/0190435 A1 | 9/2005 | Shafer et al. |
| 2005/0213066 A1 | 9/2005 | Sumiyoshi |
| 2005/0225737 A1 | 10/2005 | Weissenrieder et al. |
| 2005/0225738 A1 | 10/2005 | Takeshi |
| 2005/0237504 A1 | 10/2005 | Nagasaka et al. |
| 2005/0248856 A1 | 11/2005 | Omura et al. |
| 2006/0012885 A1 | 1/2006 | Beder et al. |
| 2006/0066962 A1 | 3/2006 | Totzeck et al. |
| 2006/0203218 A1 | 9/2006 | Shirai et al. |
| 2006/0221456 A1 | 10/2006 | Shafer et al. |
| 2006/0244938 A1 | 11/2006 | Schuster |
| 2006/0291060 A1 | 12/2006 | Shirai et al. |
| 2007/0030468 A1 | 2/2007 | Takeshi |
| 2007/0091451 A1 | 4/2007 | Schuster |
| 2007/0109659 A1 | 5/2007 | Rostalski et al. |
| 2007/0165198 A1 | 7/2007 | Kneer et al. |

FOREIGN PATENT DOCUMENTS

| | | |
|---|---|---|
| DE | 221 563 A1 | 4/1985 |
| DE | 224 448 A1 | 7/1985 |
| DE | 242 880 | 2/1987 |
| DE | 199 29 403 | 12/2000 |
| DE | 101 21 346 | 11/2002 |
| DE | 101 33 841 | 2/2003 |
| EP | 0 023 231 | 2/1981 |
| EP | 0 023 243 | 2/1981 |
| EP | 0 418 427 | 3/1991 |
| EP | 0 605 103 | 7/1994 |
| EP | 0 834 773 A2 | 4/1998 |
| EP | 0 887 708 | 12/1998 |
| EP | 1 039 511 | 9/2000 |
| EP | 1 316 849 | 6/2003 |
| EP | 1 420 302 | 5/2004 |
| EP | 1 429 190 | 6/2004 |
| EP | 1 431 826 | 6/2004 |
| EP | 1 510 871 A2 | 3/2005 |
| FR | 2474708 | 7/1981 |
| JP | 57-153433 | 9/1982 |
| JP | 58-202448 | 11/1983 |
| JP | 59-19912 | 2/1984 |
| JP | 62-065326 | 3/1987 |
| JP | 62-121417 | 6/1987 |
| JP | 63-157419 | 6/1988 |
| JP | 4-305915 | 10/1992 |
| JP | 4-305917 | 10/1992 |
| JP | 5-062877 | 3/1993 |
| JP | 6-053120 | 2/1994 |
| JP | 6-124873 | 5/1994 |
| JP | 6-140304 | 5/1994 |
| JP | 6-140306 | 5/1994 |
| JP | 7-132262 | 5/1995 |
| JP | 7-220990 | 8/1995 |
| JP | 8-316125 | 11/1996 |
| JP | 10-154659 | 6/1998 |
| JP | 10-163099 | 6/1998 |
| JP | 10-214786 | 8/1998 |
| JP | 10-228661 | 8/1998 |
| JP | 10-255319 | 9/1998 |
| JP | 10303114 A | 11/1998 |
| JP | 10-340846 | 12/1998 |
| JP | 11-176727 | 7/1999 |

| | | |
|---|---|---|
| JP | 2000-58436 | 2/2000 |
| JP | 2000-131503 | 5/2000 |
| JP | 2000-505958 | 5/2000 |
| JP | 2001-091849 | 4/2001 |
| JP | 2004-193252 | 7/2004 |
| JP | 2004-207711 | 7/2004 |
| JP | 2004-259966 | 9/2004 |
| KR | 10-245414 | 11/1999 |
| WO | WO 98/28665 | 7/1998 |
| WO | WO 99/49504 | 9/1999 |
| WO | WO 02/093209 | 11/2002 |
| WO | WO 02/99450 | 12/2002 |
| WO | WO 03/009062 | 1/2003 |
| WO | WO 03/077034 | 9/2003 |
| WO | WO 03/077036 A1 | 9/2003 |
| WO | WO 03/077037 A1 | 9/2003 |
| WO | WO 2004/019128 | 3/2004 |
| WO | WO 2004/053596 | 6/2004 |
| WO | WO 2004/053950 | 6/2004 |
| WO | WO 2004/053951 | 6/2004 |
| WO | WO 2004/053952 | 6/2004 |
| WO | WO 2004/053953 | 6/2004 |
| WO | WO 2004/053954 | 6/2004 |
| WO | WO 2004/053955 | 6/2004 |
| WO | WO 2004/053956 | 6/2004 |
| WO | WO 2004/053957 | 6/2004 |
| WO | WO 2004/053958 | 6/2004 |
| WO | WO 2004/053959 A1 | 6/2004 |
| WO | WO 2004/055803 | 7/2004 |
| WO | WO 2004/057589 | 7/2004 |
| WO | WO 2004/057590 | 7/2004 |
| WO | WO 2004/107048 | 12/2004 |
| WO | WO 2005/069055 | 7/2005 |
| WO | WO 2005/078773 | 8/2005 |

OTHER PUBLICATIONS

M. Switkes and M. Rothchild, Immersion lithography at 157nm, J. Vas. Sci. Technol. B, Nov./Dec. 2001, pp. 2353-2356, vol. 19, No. 6.
Nikon Precision Europe GmbH, "Investor's Relations—Nikon's Real Solutions," May 15, 2003.
"Depth of Focus Enhancement Using High Refractive Index Layer on the Imaging layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin., "The $k_3$ coefficient in nonparaxial NNA scaling equations for resolution, depth of focus, and immersion lithography", J. Microlith., Microfab., Microsyst. 1(1):7-12 (2002).
B.J. Lin, "Drivers, Prospects and Challenges for Immersion Lithography", TSMC, Inc., Sep. 2002.
B.J. Lin, "Proximity Printing through Liquid," IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
B.W. Smith et al., "Immersion Optical Lithography at 193nm", Future FAB International, vol. 15, Jul. 11, 2003.
G. Owen et al., "1/8μm Optical Lithography", J. Vac. Sci Technol. B., vol. 10, No. 6, Nov./Dec. 1992, pp. 3032-3036.
G.W.W. Stevens, "Reduction of Waste Resulting from Mask Defects", Solid State Technology, Aug. 1978.
H. Hata, The Development of Immersion Exposure Tools, Litho Forum, International SEMATECH, Los Angeles, Jan. 27-29, 2004, slide Nos. 1-22.
H. Hogan, "New Semiconductor Lithography Makes a Splash", Photonics Spectra, Photonics TechnologyWorld, Oct. 2003 Edition, pp. 1-3.
H. Kawata et al., "Fabrication of 0.2μM Fine Patterns Using Optical Projection Lithography with an Oil Immersion Lens", Jpn. J. Appl. Phys. vol. 31 (1992), pp. 4174-4177.
H. Kawata et al., "Optical Projection Lithography using Lenses with Numerical Apertures Greater than Unity", Microelectronic Engineering 9 (1989), pp. 31-36.
J.A. Hoffnagle et al., "Liquid immersion deep-ultraviolet interferometric lithography", J. Vac. Sci. Technol. B 17(6), Nov./Dec. 1999, pp. 3306-3309.
M Switkes et al., "Immersion lithography at 157 nm", MIT Lincoln Lab, Orlando 2001-1, Dec. 17, 2001. 2353-2356.
M Switkes et al., "Immersion lithography: Optics for the 50 nm Node", 157 Anvers-1, Sep. 4, 2002.
S. Owa and N. Nagasaka, "Potential Performance and Feasibility of Immersion Lithography", NGL Workshop 2003, Jul. 10, 2003, slide Nos. 1-33.
S. Owa et al., "Advantage and Feasibility of Immersion Lithography", Proc. SPIE 5040 (2003).
S. Owa et al., "Immersion lithography; its potential performance and issues", SPIE Microlithography 2003, 5040-186, Feb. 27, 2003.
S. Owa et al., "Update on 193nm immersion exposure tool", Litho Forum, International SEMATECH, Los Angeles, Jan. 27-29, 2004, slide Nos. 1-51.
T. Matsuyama et al., "Nikon Projection Lens Update", SPIE Microlithography 2004, 5377-65, Mar. 2004.

* cited by examiner

PROJECTION OBJECTIVE FOR IMMERSION LITHOGRAPHY

The present application claims priority benefit to U.S. Provisional 60/530,623, filed Dec. 19, 2003; U.S. Provisional 60/530,978, filed Dec. 22, 2003; U.S. Provisional 60/544,967, filed Feb. 13, 2004; U.S. Provisional 60/568,006, filed May 4, 2004; U.S. Provisional 60/591,775, filed Jul. 27, 2004; U.S. Provisional 60/592,208, filed Jul. 29, 2004; U.S. Provisional 60/612,823, filed Sep. 24, 2004; and German Application 102004051730.4, filed Oct. 22, 2004. The disclosures of all of these foreign and domestic applications are incorporated into this application by reference.

The invention relates to a projection objective for imaging a pattern arranged in an object plane of the projection objective into an image plane of the projection objective with the aid of an immersion medium arranged between an optical element of the projection objective and the image plane.

Photolithographic projection objectives have been used for several decades for fabricating semiconductor components and other finely patterned devices. They serve for projecting patterns from photomasks or reticles, also referred to hereinafter as masks or reticles, onto an article coated with a light-sensitive layer with very high resolution on a demagnifying scale.

Principally, three developments proceeding in parallel are contributing to the production of ever finer structures of the order of magnitude of 100 nm or less. Firstly, attempts are being made to increase the image-side numerical aperture (NA) of the projection objectives beyond the currently customary values into the range of NA=0.8 or higher. Secondly, ever shorter wavelengths of ultraviolet light are being used, preferably wavelengths of less than 260 nm, for example 248 nm, 193 nm, 157 nm or less. Finally, other measures for enhancing the resolution are also being used, for example phase-shifting masks and/or oblique illumination.

There are also already approaches for improving the resolution that can be obtained by introducing an immersion medium having a high refractive index into the space between the last optical element of the projection objective and the substrate. This technique is referred to here as immersion lithography. The projection objectives suitable for this are referred to as immersion objectives. Introduction of the immersion medium results in an effective wavelength $\lambda_{eff}=\lambda_0/n_I$, where $\lambda_0$ is the vacuum operating wavelength and $n_I$ is the refractive index of the immersion medium. This results in a resolution $R=k_1(\lambda_{eff}/NA_0)$ and a depth of focus (DOF) $DOF=\pm k_2(\lambda_{eff}/NA_0^2)$, where $NA_0=\sin\Theta_0$ is the "dry" numerical aperture and $\Theta_0$ is half the aperture angle of the objective. The empirical constants $k_1$ and $k_2$ are process-dependent.

The theoretical advantages of immersion lithography reside in the reduction of the effective operating wavelength and the thus improved resolution. This can be achieved with an unchanged vacuum wavelength, so that technologies that have been established for the corresponding wavelength with respect to the generation of light, with respect to the selection of optical materials, with respect to the coating technology, etc. can be adopted largely unchanged. The use of immersion media is additionally a prerequisite for the use of projection objectives having very high numerical apertures in the range of NA=1 or higher.

For 193 nm, ultrapure water where $n_I\approx1.437$ is notable as a suitable immersion liquid.

The article "Immersion Lithography at 157 nm" by M. Switkes and M. Rothschild, J. Vac. Sci. Technol. B19(6), November/December 2001, page 1 et seq., presents immersion liquids based on perfluoropolyethers (PFPE), which are sufficiently transparent for an operating wavelength of 157 nm and are compatible with some photoresist materials that are currently used in microlithography. One tested immersion liquid has a refractive index $n_I=1.37$ at 157 nm. The publication also presents a lens-free optical system for immersion interference lithography which operates with calcium fluoride elements and silicon mirrors and is intended to enable the imaging of 60 nm structures and below at a numerical aperture of NA=0.86.

The applicant's patent applications WO 03/077036 and WO 03/077037 show refractive projection objectives for microlithography which are suitable for immersion lithography on account of high image-side numerical aperture.

The use of liquid immersion media represents a challenge not only for the optical design of projection objectives; at other points, too, modifications of known processes and devices are necessary in order to obtain stable processes.

The patent specification U.S. Pat. Nos. 4,480,910 and 5,610,683 (corresponding to EP 0 605 103) describe projection exposure apparatuses provided for immersion lithography and having devices for introducing immersion fluid between the projection objective and the substrate.

The Japanese patent application JP 10-303114 A shows a projection exposure apparatus provided for immersion lithography. In order to reduce imaging problems on account of heating of the immersion liquid, the use of an aqueous immersion liquid having only a low temperature coefficient of the refractive index is proposed. The intention is thereby to reduce temperature-dictated variations in refractive index and losses in imaging quality that are caused thereby.

One object of the invention is providing a projection objective which is suitable for immersion lithography and whose imaging quality is stable even in the event of prolonged contact being made with immersion liquid.

Various formulations of the invention are reflected in the independent claims. Advantageous developments are specified in the dependent claims. The wording of all of the claims is made the content of the description by reference.

One formulation of the invention provides a projection objective for imaging a pattern arranged in an object plane of the projection objective into an image plane of the projection objective, which operates with the aid of an immersion medium arranged between an optical element and the projection objective and the image plane. The optical element has a substrate that is transparent to the operating wavelength of the projection objective and a protective layer system that is fitted to the substrate, is provided for contact with the immersion medium and serves for increasing the resistance of the optical element to degradation caused by the immersion medium.

The optical element provided with the protective layer system is preferably the last optical element in the light path, which is followed directly by the image plane.

The protective layer system is designed in such a way that a substantial lengthening of the service life of the projection objective results compared with projection objectives without such a protective layer system. This means, in particular, that the optical properties of the optical element which comes into contact with the immersion medium, or of the projection objective as a whole, remain within a specification range for substantially longer than without the protective layer system. The invention takes account of the fact that, in the event of a prolonged contact between a possibly aggressive immersion medium and the projection objective, the optical properties of the projection objective which are crucial for the imaging are impaired for example by virtue of the fact that the immersion medium chemically and/or physically attacks the optical element that comes into contact with the immersion medium, that is to say the substrate and/or a coating fitted to the substrate, and thus leads to an impairment of its optical properties that are prescribed by the design. This effect is avoided by the invention or at least significantly reduced in such a way that the service life of the projection objective is not limited by immersion-dictated degradation of the optical properties of the optical element that comes into contact with the immersion medium.

Since generally only the last optical element in the light path comes into contact with the immersion medium, the optical element that comes into contact with immersion medium is hereinafter also referred to as "the last optical element". However, the advantages of the invention can be obtained even when the optical element that comes into contact with the immersion medium is the first element in the light path or an optical element arranged within the projection objective. Therefore, the term "the last optical element" is representative in many cases of an optical element which is provided for contact with an immersion medium.

A protective layer system in the sense of this application may be formed by a single material layer. By way of example, an essentially plane-parallel plate made of a transparent bulk material or a thin single layer produced in a thin-film method may be involved. A protective layer system may also comprise a plurality of material layers lying one above the other and be formed e.g. as a dielectric alternating layer system or as a coated plate.

In one development, the substrate consists of a fluoride crystal material, in particular of calcium fluoride. The use of fluoride crystal materials for the last optical element is practically mandatory in the case of systems for operating wavelengths of 157 nm or less since other optical materials, for example synthetic quartz glass, are generally not sufficiently transparent to this wavelength. In the case of systems for higher wavelengths, for example 193 nm, as well, the use of calcium fluoride for the last optical element may be expedient since this element arranged near to the image plane is exposed to high radiation loads and calcium fluoride, in contrast to synthetic quartz glass, has a lower tendency toward radiation-induced density changes. On the other hand, the inventors have discovered that calcium fluoride is sparingly soluble in water, with the result that the substrate material would be chemically attacked when using water or aqueous solutions as immersion liquid. This can be avoided by means of the invention. In other embodiments, the last optical element consists of synthetic quartz glass.

The invention can be used independently of the form of the last optical element. In some embodiments, the last optical element is a planoconvex lens having a spherically or aspherically curved entry face and an essentially planar exit face to which the protective layer system is fitted. In other embodiments, the last optical element is an essentially plane-parallel plate, which is exchangeable in some embodiments. The plane-parallel plate may, by way of example, be wrung onto a penultimate optical element or be connected thereto optically neutrally in a different way. An exchangeable last optical element facilitates maintenance work particularly if the optical properties of the last optical element should deteriorate beyond a tolerable extent over the course of time owing to the use of an immersion medium.

In many cases it may suffice for the protective layer system to be essentially fitted only to the image-side exit face of the last optical element. There are also embodiments in which the protective layer system is fitted to the image-side exit face of the substrate and also extends continuously over adjoining side areas of the substrate. If appropriate, the protective layer system may also extend right over the image-remote entry face of the substrate. Consequently, depending on the requirement, it is possible to create an "all round protection" for jeopardized surfaces of the substrate which, if appropriate, might be wetted by creeping immersion medium in the absence of such protection.

In one development, the protective layer system comprises at least one barrier layer that is essentially impermeable to the immersion medium. The barrier layer may comprise of at least one barrier layer material that is essentially chemically resistant to the immersion medium, and be essentially free of pores passing through from an outer side of the barrier layer that is remote from the substrate to the side of the barrier layer that faces the substrate. A barrier layer can be used to prevent immersion medium from penetrating as far as the substrate to a significant degree. The barrier layer may be provided by itself or in combination with further material layers. A barrier layer may be formed as a single layer or as a multilayer.

If particles such as polishing residues, dust or the like and/or mechanical damage such as scratches or the like are present on the surface of the substrate to be protected prior to coating as a consequence of preceding processing steps, there is the risk of a coating applied to this non-ideal surface being disturbed directly in the vicinity of these critical locations, with the result that the substrate material cannot be totally sealed against immersion liquid. As a result, the substrate material may be attacked at points in the region of defects in a coating. In one development problems resulting from this are avoided or reduced by means of a particular method variant in the production of the protective layer system. Firstly, a first layer of a multilayer system is applied on the substrate or on a coating applied on the substrate. Afterward, a portion of the first layer is removed again with the aid of an, in particular, mechanical polishing method, as a result of which a polishing surface arises on the partly removed first layer. Afterward, a second layer is applied to said polishing surface of the first layer. If appropriate, the steps of partial removal of an underlying layer by polishing and subsequent coating with a subsequent layer are repeated once or a number of times. Cleaning of the polishing surface is preferably carried out between the removal step and the subsequent coating. During the removal step, generally some of the particles are sheared off or torn out from the coated area. During the subsequent coating of the second layer, generally particles will then admittedly be present again, but not at the same locations. The method steps can be repeated as often as until every particle has been removed at least once. If defects remain within the individual layers during this multiple coating, then the defects in the first and second layers are largely or completely distributed at different lateral positions within the layers, with the result that a defect-free region exists in at least one of the layers of the multilayer system essentially at every location of the latter. As a result, the multilayer system is impermeable to the immersion medium over its entire lateral extent in the direction perpendicular to the layer extent.

All of the layers of the multilayer system may consist of the same material. It is also possible for layers made of different materials to be produced, as a result of which e.g. an alternating layer system may be created.

The protective layer system may contain at least one barrier layer having at least one fluoride material which is essentially transparent to the corresponding operating wavelength and is also essentially insoluble with respect to the immersion medium. In particular, depending on the operating wavelength, the barrier layer may contain at least one of the following materials or essentially consist of such a material:

actinium fluoride ($AcF_3$), bismuth fluoride ($BiF_3$), erbium fluoride ($ErF_3$), europium fluoride ($EuF_3$), gadolinium fluoride ($GdF_3$), holmium fluoride ($HoF_3$), potassium magnesium fluoride ($KMgF_3$), lanthanum fluoride ($LaF_3$), sodium yttrium fluoride ($NaYF_4$), neodymium fluoride ($NdF_3$), samarium fluoride ($SmF_3$), terbium fluoride ($TbF_3$), titanium fluoride ($TiF_3$), thulium fluoride ($TmF_3$), vanadium fluoride ($VF_3$), ytterbium fluoride ($YbF_3$), yttrium fluoride ($YF_3$). All of the materials mentioned are suitable down to 193 nm. In particular, the rare earth fluorides $ErF_2$, $GdF_3$, $LaF_3$ and also $KMgF_3$ can also be used at 157 nm.

It is also possible for the protective layer system to comprise at least one barrier layer that contains at least one of the following oxide materials or essentially consists of one of said materials: silicon dioxide ($SiO_2$), magnesium aluminum oxide ($MgAl_2O_4$), aluminum oxide ($Al_2O_3$), tungsten dioxide ($WO_2$), tungsten trioxide ($WO_3$). In this case, all materials are suitable to 193 nm, and $SiO_2$ can also be used at 157 nm if small layer thicknesses are chosen.

In one development, the barrier layer essentially consists of an oxidic material having a high packing density. The packing density should be more than 95%, in particular more than 97%, preferably more than 98%, of the density of the bulk material. Refractive index differences with respect to the bulk material, relative to the refractive index of isotropic substances or to the average refractive index of anisotropic substances for the ordinary and extraordinary rays, should be less than 5%, preferably less than 3%, in particular less than 2%.

The use of silicon dioxide ($SiO_2$) is particularly favorable since this material can be used down to 193 nm as an absorption-free material having a low refractive index in interference layer systems and can be applied substantially in a manner free of pores given suitable coating technology. It is particularly expedient if the barrier layer essentially consists of ion-sputtered oxide material, in particular silicon dioxide. Experiments have shown that, in the case of ion enhanced deposition of silicon dioxide or other oxide materials, the packing density of the deposited material can be significantly increased, thereby promoting the suitability as a barrier layer against an immersion medium.

Another possibility consists in applying the barrier layer material, in particular silicon dioxide, in a PECVD method. In the case of plasma enhanced chemical vapor deposition, the constituents are supplied in gaseous form as monomers and activated chemically in a microwave plasma. Given suitable process conditions, a hydrocarbon-free, only weakly absorbent and essentially pore-free oxide layer, e.g. a quartz layer, forms on the substrate.

In one development, it has proved to be expedient if the barrier layer has an optical layer thickness of between approximately 0.15 λ and 0.6 λ, in particular between approximately 0.2 λ and 0.3 λ, or between approximately 0.4 λ and 0.6 λ, where λ is the operating wavelength of the projection objective. This is expedient particularly when, for a refractive index difference Δn between barrier layer material and immersion medium, the following holds true: Δn≧0.04. Such layers may be used by themselves or in conjunction with further layers made of dielectric material having a high refractive index or low refractive index as an interference layer system with a reflection-reducing effect. By way of example, the barrier layer itself may be designed as an antireflection layer. For this purpose, its layer thickness may essentially correspond to a quarter of the operating wavelength or an odd multiple thereof. The optical layer thickness of the barrier layer may also be adapted to the optical properties of a monolayer or multilayer system adjoining the barrier layer in such a way that a reflection-reducing effect is established in conjunction with the layer system. Barrier layers having a geometrical layer thickness of ≦15 nm are also possible.

In some embodiments, the barrier layer is applied directly to an exit-side surface of the substrate. It is possible for an antireflection layer system to be applied to a surface of the barrier layer that is remote from the substrate. As an alternative or in addition, it is also possible for an antireflection layer system to be arranged between the substrate and the barrier layer. In both cases, the antireflection layer system may be formed by a single layer or by a multilayer system comprising a plurality of single layers having dielectric material alternately having a high refractive index and having a low refractive index.

The dielectric materials should be selected such that they are essentially absorption-free at the operating wavelength provided. Each of the layers having a low refractive index may contain, depending on the operating wavelength, one of the following materials exclusively or in combination with other materials of this group: magnesium fluoride ($MgF_2$), aluminum fluoride ($AlF_3$), chiolite ($Na_5Al_3F_{14}$), cryolite ($Na_3AlF_6$), silicon dioxide ($SiO_2$). Each of the layers having a high refractive index may contain one of the following materials exclusively or in combination with other materials of this group: lanthanum fluoride ($LaF_3$), gadolinium fluoride ($GdF_3$), erbium fluoride ($ErF_3$), aluminum oxide ($Al_2O_3$), hafnium oxide ($HfO_2$), zirconium dioxide ($ZrO_2$), holmium fluoride ($HoF_3$), neodymium fluoride ($NdF_2$), samarium fluoride ($SmF_3$), terbium fluoride ($TbF_3$), titanium fluoride ($TiF_3$), yttrium fluoride ($YF_3$), ytterbium fluoride ($YbF_3$), magnesium aluminum oxide ($MgAl_2O_4$), tungsten trioxide ($WO_3$) and tungsten dioxide ($WO_2$).

If an antireflection layer system is provided for contact with the immersion medium, consideration should be given to a lowest possible removal rate during operation. Therefore, from the material groups mentioned, those materials are preferred in the case of which the removal rate with respect to ultrapure water is less than approximately 0.01 mg/($cm^2 \cdot day$), in particular less than 0.005 or 0.002 mg/($cm^2 \cdot day$).

In one embodiment, a magnesium fluoride/lanthanum fluoride alternating layer system is provided.

It has been found that, as an alternative to inorganic materials, it is also possible to use other materials with a hydrophobic effect for producing barrier layers. In one development, the protective layer system comprises at least one barrier layer made of a perfluorinated fluorocarbon that is essentially water-impermeable to the immersion medium. By way of example, perfluorinated alkanes and siloxanes can be used. Suitable products are sold for example by the company Merck under the designations WR1, WR2 or WR3 or WR4. It has been found that WR3 is expedient particularly in conjunction with fluoridic materials, while WR1 and WR2 are expedient particularly in combination with oxidic materials. It is also possible to use polytetrafluoroethylene (PTFE), which is known inter alia by the trade name Teflon®.

It is also possible to use liquid materials or materials exhibiting lubricity for the formation of a protective layer system. When using ultrapure water as the immersion medium, it is possible to use, by way of example, oils or greases suitable for vacuum technology, such as the vacuum oil available under the designation Fomblin. Other greases based on fluoropolyethers (PFPE) are also possible. During operation of the projection exposure apparatus, the liquid protective medium or protective medium exhibiting lubricity may be applied, if appropriate, progressively again and again to the exit face of the projection objective and adjoining areas in order to afford reliable protection against attack by the immersion medium. In this case, care must be taken to ensure that the protective film material does not contaminate the immersion medium. In the case of water, therefore, the protective film material should have no or only vanishingly sparing solubility in water.

In the design of protective layer systems according to the invention, the optical properties thereof should be adapted to the optical properties of the immersion medium, in particular to the refractive index $n_I$ thereof. The provision of protective layer systems that are adapted in terms of refractive index is possible in different ways within the scope of the invention.

In one embodiment, the protective layer system is designed as a graded index layer with a continuous or discontinuous refractive index profile perpendicular to the layer extent. In this case, preferably, a refractive index in a region near the substrate essentially corresponds to the refractive index of the substrate material and a refractive index in a region provided for contact with the immersion medium essentially corresponds to the refractive index of the immersion medium. An ideal reflection-reducing effect can be achieved, at least approximately, in this way.

A layer having a continuous gradient may be implemented for example by joint deposition of two or more dielectric materials having a different refractive index, the ratio of which changes in the course of deposition. It is also possible to deposit two or more different, dielectric materials alternately in order to produce a gradient of the average refractive index in small steps. A nano-layer-patterned mixed material can be produced given sufficiently small layer thicknesses.

When designing a suitable protection for projection objectives against immersion-dictated degradation of the optical properties, it must be taken into account that some immersion liquids, in particular with simultaneous irradiation with hard ultraviolet radiation, may chemically/physically attack the material that is in contact with the immersion liquid. Such wear that is essentially caused by material removal and/or chemical reactions can limit the service life of the projection objective and necessitate exchange or repair. Some embodiments provide measures that make it possible to render such more or less unavoidable surface damage optically ineffective.

For this purpose, one embodiment provides for the protective layer system to be designed as a wear system that is optimized in terms of refractive index. The wear system may be optimized with regard to its optical properties in such a way that a gradual decrease in thickness and/or a gradual change in the optical properties in the boundary region with respect to the immersion medium do not lead to a substantial change in the optical properties of the protective layer system and hence of the projection objective. In other words: the optical effect of the protective layer system becomes relatively insensitive to immersion-dictated property changes.

In accordance with one development, the protective layer system comprises a bulk material plate that is provided for contact with the immersion medium and is made of a plate material whose refractive index is less than the refractive index of the substrate, in particular of calcium fluoride. The refractive index of the plate material should preferably be in proximity to the refractive index $n_I$ of the immersion medium. An example of a plate material that is taken into consideration is lithium fluoride (LiF) where n≈1.443 at 193 nm. If, at 193 nm, ultrapure water having a refractive index of $n_I$≈1.437 is used as the immersion liquid, then the crucial refractive index difference Δn with respect to the plate material is less than 0.01, as a result of which an almost ideal refractive index adaptation is possible. The bulk material plate may be exchangeable (exchangeable plate).

Generally, when using an immersion medium having a refractive index $n_I$, it has proved to be advantageous if the protective layer system has an effective refractive index $n_{ss}$ at least in a region adjoining the immersion medium, such that Δn<0.05 holds true for a refractive index difference Δn=|$n_I$−$n_{ss}$|. Smaller refractive index differences are preferred in accordance with Δn<0.01, in particular in accordance with Δn<0.005. The optical properties of such protective layer systems are relatively insensitive to gradual material dissolution by the immersion medium, so that the protective layer systems can be used as a wear layer.

In some embodiments, a dielectric antireflection layer system having one or a plurality of single layers is arranged between the substrate and the wear system, in particular the wear plate.

It must be assumed that optically transparent materials are not available for all immersion media in order to provide, from bulk material, a wear system that is adapted in terms of refractive index with a sufficiently small refractive index difference with respect to the immersion medium and/or a reflection-reducing system. In one development, the protective layer system consists of, at least in a region adjoining the immersion medium, a mixed material having at least one first material having a low refractive index and at least one second material having a high refractive index. Preferably, the first material has a refractive index $n_L$<$\sqrt{n_I \cdot n_S}$ and the second material has a refractive index $n_H$>$\sqrt{n_I \cdot n_S}$, where $n_I$ is the refractive index of the immersion medium and $n_S$ is the refractive index of the substrate material, and a ratio of the first and second materials being chosen such that an average refractive index $n_{MIX}$ of the mixed material is present. In the selection of the material combinations, care must be taken to ensure that the mixing partners have essentially the same solubility in the immersion medium, so that the immersion medium does not selectively attack one of the components during operation. In this way, it is possible to avoid gradual alterations of the optical properties and/or an evolving porosity on account of preferred dissolution of a mixing partner.

For wear systems, the average refractive index $n_{MIX}$ can be set such that it is in proximity to the refractive index $n_I$ of the immersion medium. Preferably, Δn<0.05 holds true, in particular Δn<0.01 or Δn<0.005 holds true, where Δn=|$n_I$−$n_{MIX}$|.

If the intention is to provide an essentially wear-free protective layer system having optimized reflection-reducing properties, then it may be expedient for $n_{MIX}$≈$\sqrt{n_I \cdot n_S}$ to be set. An average refractive index in the region of the geometric mean of the refractive indices of the materials adjoining on both sides ensures that the reflected amplitudes at the interfaces between substrate and protective layer and also between protective layer and immersion medium have essentially the same magnitude, with the result that an optimum destructive interference becomes possible given suitable setting of the relative phase of reflected partial beams. Preferably, at least one of the following conditions should be met: $n_{MIX}$=$\sqrt{n_I \cdot n_S}$±2%, in particular ±1% and/or |$\sqrt{n_I \cdot n_S}$−$n_{MIX}$|<0.02, in particular <0.01. This enables optically effective monolayer antireflection layers having optical thicknesses l·$d_{QWOT}$ where $d_{QWOT}$ is the layer thickness of a quarter wave layer of the material and l is an odd integer.

The mixed material may be constructed as a nanopatterned multilayer material or as a material with a continuous or homogeneous mixture of two or more components. In an embodiment designed for 193 nm, magnesium fluoride (MgF$_2$) and lanthanum fluoride (LaF$_3$) are deposited jointly. This combination is particularly resistant.

As an alternative to a layer system made of mixed material, it is also possible to provide a single layer made of a single material, for example a layer made of magnesium fluoride (MgF$_2$), the refractive index of which at 193 nm is approximately n≈1.44 and is thus well matched to the refractive index n=1.443 of ultrapure water at 193 nm.

It may be complicated to find a suitable coating process (for example vapor deposition, sputtering or the like) which guarantees a hole-free and scratch-free layer. Furthermore, thin layer systems produced by coating processes are generally sensitive to cleaning during operating in the field, that is to say when being operated by the customer, so that there is the risk of the protective layer system subsequently being damaged during cleaning. Some embodiments use protective layer systems which can be provided without a coating process. In this case, the protective layer system is formed by an essentially plane-parallel plate (protective plate) which is wrung onto an essentially planar interface of the substrate. During wringing, an optically neutral and, if appropriate, rereleasable connection is produced between the substrate and the wrung element. The substrate and the wrung plate may be held jointly, that is to say as a combined optical element of multipartite construction, in a common holder.

In one variant, the substrate consists of a fluoride crystal material, in particular of calcium fluoride, and the protective plate consists of synthetic quartz glass. Such embodiments are beneficial particularly when using immersion media that essentially consists of water, since the substrate material exhibiting relatively high solubility in water can be permanently protected against incipient dissolution by the chemically resistant and water-insoluble quartz glass.

If use is made of a protective plate made of synthetic quartz glass which is wrung onto a substrate made of fluoride crystal material, temperature changes may be problematic since, on account of the different coefficients of thermal expansion of plate material and substrate material, said temperature changes may lead to the production of mechanical stresses which, in unfavourable cases, may lead to the detachment of the wrung plate from the substrate and/or to damage in the interface region. In one development, the substrate consists of calcium fluoride and the wrung plate consists of barium fluoride. Barium fluoride, as fluoridic material in comparison with synthetic quartz glass, has a more favorable coefficient of thermal expansion than calcium fluoride since the difference in coefficients of thermal expansion between substrate material and plate material and thus the thermally induced stresses turn out to be smaller in this case. Moreover, the solubility of barium fluoride in water is significantly lower than that of calcium fluoride (fluorspar). As a result, it is possible to ensure a connection between substrate and protective plate that is mechanically stable even in the event of temperature fluctuations.

In one development, use is made of a protective plate having a plate thickness of less than 5 mm. Preferably, the wrung protective plate has a plate thickness of less than 3 mm, in particular of less than 2 mm or less than 1 mm. For reasons of handling, however, the plate thickness should not fall below values of 50 μm or 100 μm. The lower limit of the plate thickness prior to wringing may be chosen in such a way that the surfaces can be postprocessed after the wringing process in order to be able subsequently to correct surface deformations that are present, if appropriate, by means of local material removal and/or to reduce the plate thickness as a whole to a desired final thickness. As a result, it is possible to create protective layer systems whose thickness is greater than the layer thickness of protective layer systems produced by vapor deposition or sputtering. Typically, the latter are not thicker than 5 μm or 2 μm or 1 μm or 500 nm.

The invention also relates to a method for protecting a projection objective, which is designed for imaging a pattern arranged in an object plane of the projection objective into an image plane of the projection objective with the aid of an immersion medium arranged between an optical element of the projection objective and the image plane, against degradations of optical properties caused by the immersion medium, which method is distinguished by the fact that use is made of a cooled immersion medium having a media temperature that lies significantly below the ambient temperature at the site of use. In this case, the media temperature may be set for example to values of less than 15° C. In particular, the media temperature may be kept in the range of between approximately 10° C. and approximately 5° C. Active cooling of the immersion medium may be advantageous for various reasons. If use is made of an immersion medium which essentially consists of water, then the active cooling may reduce the dissolution aggressiveness of the immersion medium since, by way of example, the dissolution aggressiveness of water, for example with respect to calcium fluoride, decreases with its temperature. Active cooling can thus contribute to lengthening the service life of immersion systems in which optical elements made of calcium fluoride are in direct contact with water-containing immersion media or immersion media that essentially consist of water. Active cooling of the immersion medium may also be utilized for minimizing temperature fluctuations in the region of the immersion medium, even if the ambient temperature is subject to relatively greater fluctuations. In this way, by way of example, in the case of systems with a wrung plane-parallel plate as protective layer system, the occurrence of thermal stresses on account of different coefficients of thermal expansion of substrate and plate material can be limited to harmless values.

The cooling of the immersion medium with respect to the ambient temperature may also be provided in the case of immersion systems in which optical elements provided for contact with an immersion medium are present which do not have a protective layer system for increasing the resistance of the optical element to degradation caused by the immersion medium.

The problem of thermally induced stresses between a substrate of an optical element and an element that is wrung onto the substrate and may be, by way of example, a plane-parallel plate is alleviated, in accordance with another aspect of the invention, by virtue of the fact that the projection objective is assigned a temperature regulation device that is set up for keeping the region of the optical element provided with wringing at a largely constant temperature independently of fluctuations in the ambient temperature. The temperature regulation device may be activated directly after installation of the optical element provided with wringing, in order to ensure a largely constant temperature in the region of the interface between substrate and wrung element during transport between production side and envisaged site of use, during demounting at the site of use and during later operation by the end customer. The temperature regulation device may have components that are constructionally connected to the projection objective. The temperature regulation device may comprise, by way of example, one or a plurality of Peltier elements that are fixed to the holder of the optical element whose temperature is to be regulated and are electrically driven in order to cool the holder. As an alternative or in addition, it is also possible to provide on the holder fluid channels for conducting through a cooling fluid, to which an external cooling unit may be connected.

The invention has been illustrated hitherto in an exemplary manner using the example of a projection objective for microlithography in which the protective layer system may be fitted e.g. to the last optical element (in the light propagation direction). A refractive or catadioptric projection objective may be involved in this case.

However, the invention is not restricted to optical imaging systems of this type, nor is it restricted to optical imaging systems generally, but rather can also be used in other optical systems provided that the latter make use of optical elements which can come into contact with an immersion medium. The optical system may be, by way of example, a device for optically measuring another optical system, at least one space that can be filled with an immersion medium existing within the optical system for measurement or between said system and the optical system to be measured.

The invention also relates to an optical element to which is fitted a protective layer system that is provided for contact with an immersion medium and serves for increasing the resistance of the optical element to degradation caused by the immersion medium. Such immersion-resistant optical elements can be incorporated instead of conventional optical elements in conventional systems where contact between an optical element and immersion medium is provided.

The above and further features emerge not only from the claims but also from the description and from the drawings, in which case the individual features may respectively be realized by themselves or as a plurality in the form of subcombinations in an embodiment of the invention and in other fields and may constitute advantageous and inherently protectable embodiments.

FIG. 1 schematically shows a projection exposure apparatus for immersion lithography in accordance with an embodiment of the invention;

FIG. 2 schematically shows a last optical element in the form of a planoconvex lens, in the case of which a monolayer protective layer is applied on the exit side and to adjacent edge regions;

Figure 13:
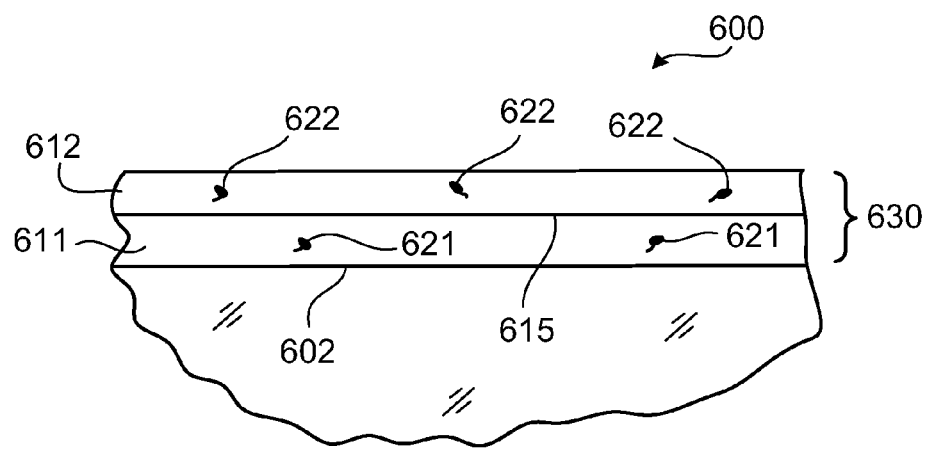
Figure 14:
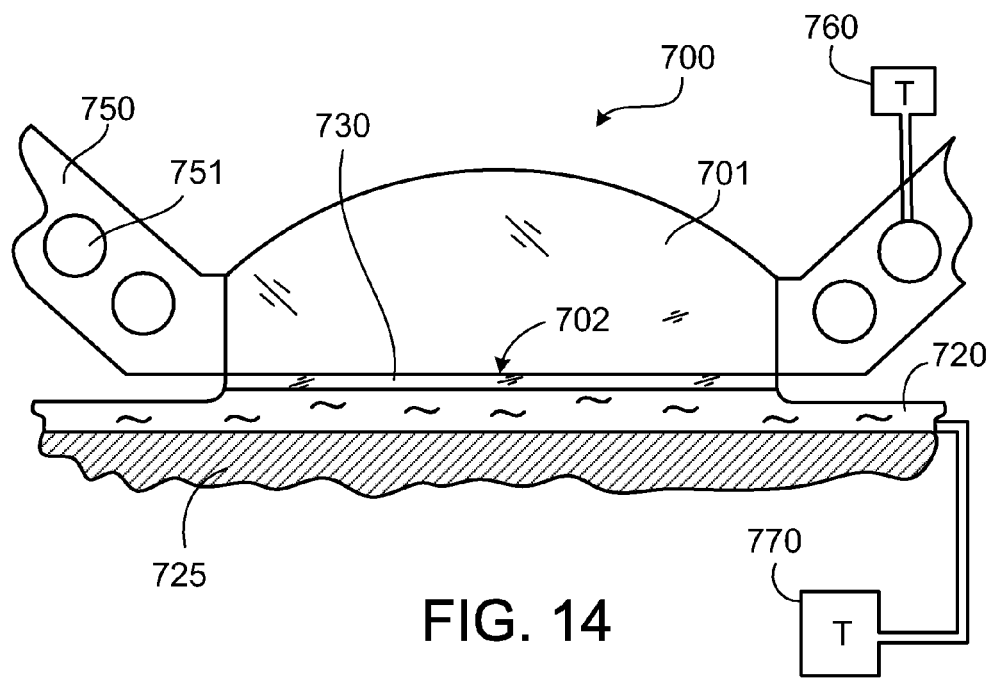

FIG. 13 shows a schematic, enlarged sectional view through a multilayer system serving as a protective layer system in accordance with another embodiment of the invention; and FIG. 14 shows a schematic section through the image-side end region of a projection objective for immersion lithography with a last optical element on the image side which has a substrate made of calcium fluoride onto which a thin protective plate made of quartz glass is wrung, temperature regulation devices for cooling the last optical element and the immersion medium being provided.

Figure 1:
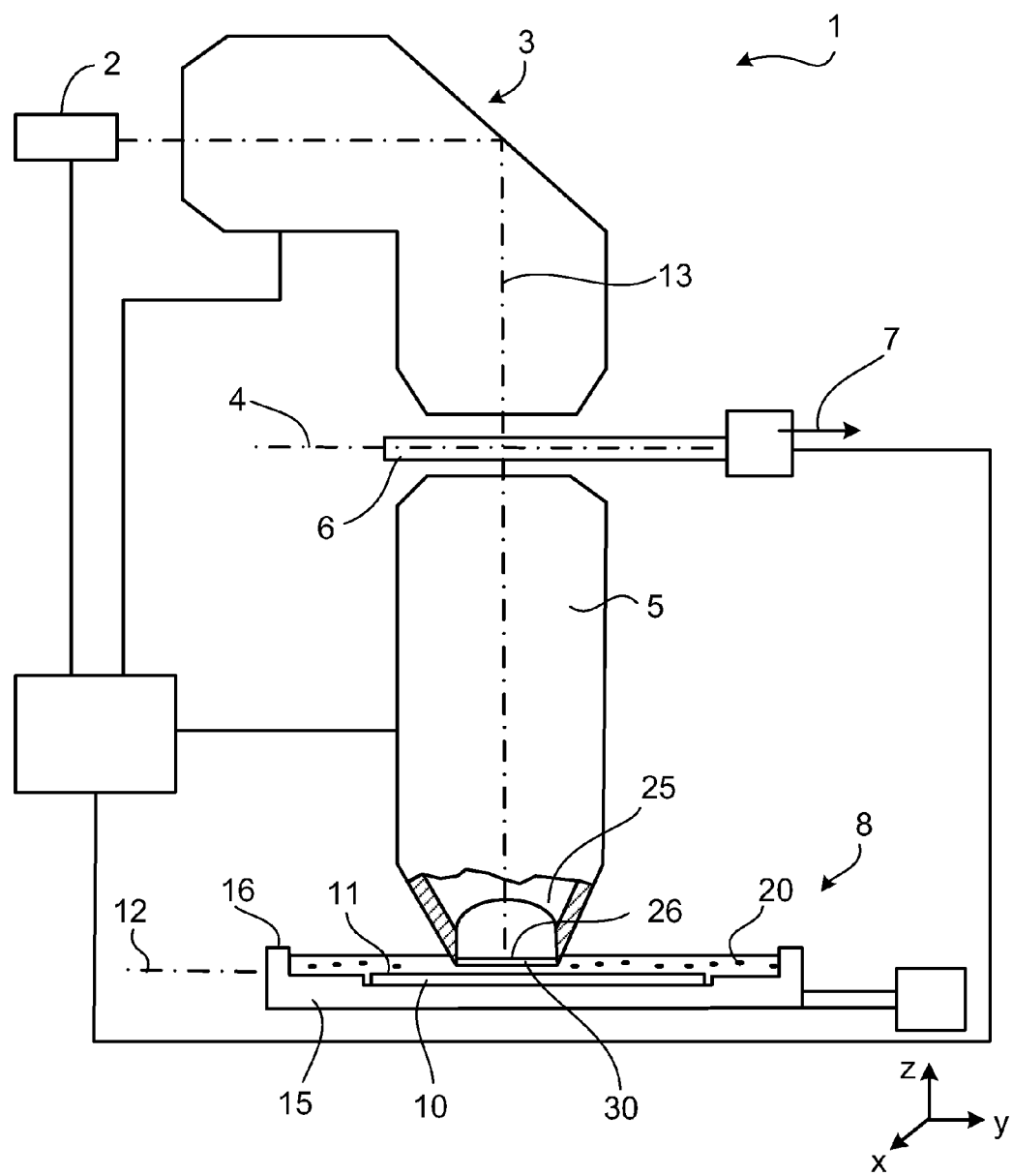
Figure 2:
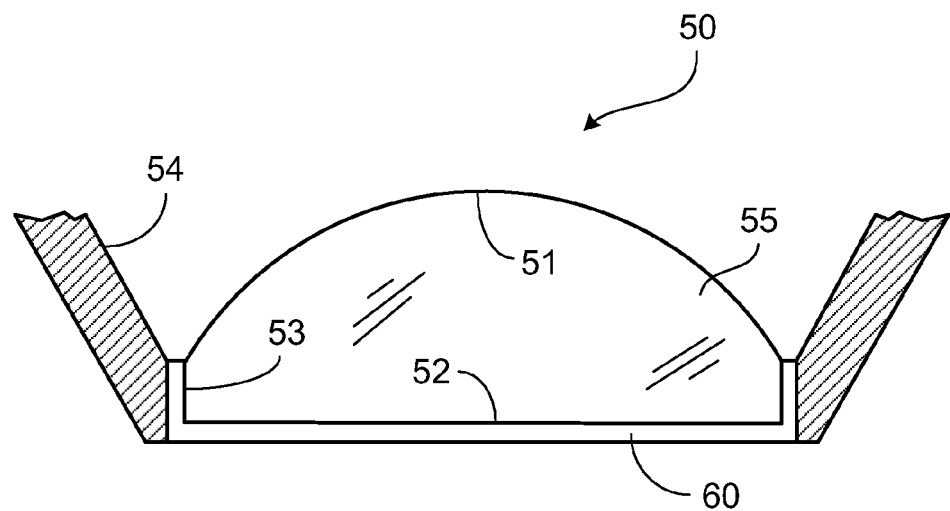

FIG. 1 schematically shows a microlithographic projection exposure apparatus in the form of a wafer stepper 1, which is provided for the fabrication of large scale integrated semiconductor components by means of immersion lithography. The projection exposure apparatus 1 comprises as light source an Excimer laser 2 having an operating wavelength of 193 nm, other operating wavelengths, for example 157 nm or 248 nm, also being possible. A downstream illumination system 3 generates, in its exit plane 4, a large, sharply delimited, very homogeneously illuminated illumination field that is adapted to the telecentric requirements of the downstream projection objective 5. The illumination system 3 has devices for selection of the illumination mode and, in the example, can be changed over between conventional illumination with a variable degree of coherence, annular field illumination and dipole or quadrupole illumination.

Arranged downstream of the illumination system is a device (reticle stage) for holding and manipulating a mask 6 in such a way that the latter lies in the object plane 4 of the projection objective 5 and can be moved in this plane for scanning operation in a travel direction 7.

The plane 4, also referred to as the mask plane, is followed downstream by the reduction objective 5, which images an image of the mask with a reduced scale of 4:1 onto a wafer 10 coated with a photoresist layer. Other reduction scales, e.g. 5:1 or 10:1 or 100:1 or less, are likewise possible. The wafer 10 serving as a light-sensitive substrate is arranged in such a way that the planar substrate surface 11 with the photoresist layer essentially coincides with the image plane 12 of the projection objective 5. The wafer is held by a device 8 comprising a scanner drive in order to move the wafer synchronously with the mask 6 in parallel with the latter. The device 8 also comprises manipulators in order to move the wafer both in the z direction parallel to the optical axis 13 of the projection objective and in the x and y directions perpendicular to said axis. A tilting device having at least one tilting axis running perpendicular to the optical axis 13 is integrated.

The device 8 provided for holding the wafer 10 (wafer stage) is constructed for use in immersion lithography. It comprises a receptacle device 15, which can be moved by a scanner drive and the bottom of which has a flat recess for receiving the wafer 10. A peripheral edge 16 forms a flat, upwardly open, liquid-tight receptacle for a liquid immersion medium 20, which can be introduced into the receptacle and discharged from the latter by means of devices that are not shown. The height of the edge is dimensioned in such a way that the immersion medium that has been filled in can completely cover the surface 11 of the wafer 10 and the exit-side end region of the projection objective 5 can dip into the immersion liquid given a correctly set operating distance between objective exit and wafer surface.

The projection objective 5 has an image-side numerical aperture NA of at least NA=0.80, but preferably of more than 0.98, and is thus particularly adapted to the use of immersion fluids having a high refractive index. Suitable refractive projection objectives are disclosed for example in the applicant's patent applications WO 03/077036 and WO 03/077037, the disclosure content of which is made the content of this description by reference.

The projection objective 5 has a planoconvex lens 25 as the last optical element nearest the image plane 12, the planar exit face 26 of said lens being the last optical face of the projection objective 5. During operation of the projection exposure apparatus, the exit side of the last optical element is completely immersed in the immersion liquid 20 and is wetted by the latter. In the exemplary case, ultrapure water having a refractive index $n_I \approx 1.437$ (193 nm) is used as the immersion liquid.

A particular feature of the projection objective 5 consists in the fact that the planar exit face 26 of the planoconvex lens 25 produced from calcium fluoride has a protective layer system 30 for increasing the resistance of the last optical element to immersion-dictated degradation. The protective layer 30 can be used to prevent the slightly water-soluble substrate material calcium fluoride from being attacked and gradually dissolved by the immersion liquid. Moreover, the protective layer system 30 is optimized by a suitable selection of layer material and layer thickness in such a way that it acts as an antireflection coating for the interface between the optical arrangement and the immersion liquid. In this case, the protective layer thickness is optimized with regard to resolution behavior and the imaging errors induced by the resolution.

The protective layer system 30 is designed as dielectric single layer. Such a single layer acts as an antireflection layer when its refractive index $n_{ss}$ lies between the refractive index $n_s$ of the substrate and the refractive index $n_I$ of the immersion medium. If the geometric mean of the refractive indices of the immersion liquid and of the substrate material is taken as the refractive index $n_{ss}$ for the single layer ($n_{SS}=\sqrt{n_I \cdot n_S}$), then the antireflection effect of the single layer becomes optimal in the event of light incidence with an angle of incidence $I_0$ and a given operating wavelength $\lambda$ if the following holds true for the single layer thickness:

$$D_{L4} = 1 \cdot \frac{\lambda}{4 \cdot n_{SS} \cdot \cos(I)},$$

where I is odd. In this case, I is the refracted angle and the relationship between the refracted angle I and the angle of incidence $I_0$ is given by Snell's law: $n_s \cdot \sin I_0 = n_{ss} \cdot \sin I$. Consequently, single layers whose optical layer thickness corresponds to a quarter of the wavelength ($\lambda/4$) or an odd multiple thereof are expedient. In the exemplary system (calcium fluoride/water at 193 nm where I=0°) with $n_{H_2O}=1.437$ and $n_{CaF_2}=1.502$, this is possible if the material of the single layer has a refractive index $n_{SS}=\sqrt{n_{H_2O} \cdot n_{CaF_2}}=1.469$ and the following holds true for the geometric layer thickness: $d_{L4}=I \cdot 32.8$ nm, where I=1, 3, 5, . . . . In other embodiments in which the substrate for the last optical element consists of synthetic quartz glass ($n_{SiO_2}=1.552$), the material of the single layer has an optimized refractive index $n_{SS}=\sqrt{n_{H_2O} \cdot n_{SiO_2}}=1.493$ and the geometric layer thickness of the single layer is $d_{L4}=I \cdot 32.3$ nm (I=0°).

On account of the relatively small refractive index differences between immersion medium and protective layer and between protective layer and substrate, such single layers have a good reflection-reducing effect even at high angles of incidence such as typically occur in the case of projection objectives with high numerical apertures. In a departure from the above exemplary calculation, the thickness of the single layer should be optimized for high angles of incidence in these cases.

A unary system made of a material whose refractive index lies between $n_I$ and $n_s$ is preferably used for the single layer. In the case of a unary system, it is advantageous, inter alia, that no inhomogeneities can result on account of material-dictated unequal removal.

For the cases in which the dielectric materials available under the given conditions have refractive indices lying outside a desired refractive index range, it is possible to use material mixtures or mixed materials having two or more components which have an effective refractive index $n_{MIX}$ in the desired range. In this case, at least one material having a low refractive index with a refractive index $n_L<\sqrt{n_I \cdot n_S}$ and at least one material having a high refractive index with a refractive index $n_H>\sqrt{n_I \cdot n_S}$ should be used in a suitable mixture ratio. For the immersion systems considered here, these are, by way of example, for the materials having a low refractive index, aluminum fluoride, chiolite, cryolite, magnesium fluoride, sodium fluoride, lithium fluoride or mixtures of these materials and, for the materials having a high refractive index, lanthanum fluoride, erbium fluoride, gadolinium fluoride, neodymium fluoride, lead fluoride, silicon dioxide, calcium fluoride, aluminum oxide, thorium fluoride and mixtures of these materials. If materials of comparable solubility in the immersion medium are chosen, then it is possible largely to prevent material-dictated inhomogeneities during removal and, if appropriate, a porosity evolving as a result. Mixed systems comprising magnesium fluoride and lanthanum fluoride may be advantageous on account of the sparing solubility of these materials particularly in ultrapure water since such a layer system can satisfy the optimum thickness conditions for a long time.

When defining the initial geometric layer thickness of the reflection-reducing protective layer 30, it should be taken into account that the protective layer thickness may decrease due to attack by the immersion medium over the lifetime of the projection objective. The initial protective layer thickness should be chosen such that a sufficiently thick residual protective layer still remains after an expected lifetime of the projection objective for a given rate of removal. The design may for example fix final layer thicknesses such that, for an angle of incidence of 0°, they at least still have a geometric layer thickness of $\lambda/4$ or $\lambda/8$ and/or a geometric layer thickness of at least 15 nm. If the immersion medium is lead past the last optical element in a flowing manner during the exposure processes or between exposure processes, care must be taken to ensure that the flow does not lead to an inhomogeneous removal of the protective layer, rather that an essentially isotropic removal is ensured. Depending on the system, the initial geometric layer thicknesses may be in the micrometers range, for example more than 10 μm or more than 5 μm or more than 2 μm. In this case, the maximum layer thickness may be limited by the production of layer stresses.

Further exemplary embodiments, in which the layer system acts as a barrier layer, are explained with reference to FIGS. 2 to 5. In the case of the embodiment in accordance with FIG. 2, the last optical element 50 is a planoconvex lens having a spherical entry face 51, a planar exit face 52 and a cylindrical edge 53 which adjoins the exit face and on which the holder 54 of the lens engages. The protective layer system 60 consists of a single layer made of essentially pore-free silicon dioxide which has been deposited by plasma enhanced chemical vapor deposition (PECVD) on the transparent substrate 55. This coating method, in which the layer constituents are supplied in gaseous form as monomers and are chemically activated in a microwave plasma, makes it possible to produce on the substrate a hydrocarbon-free, only weakly absorbent and essentially pore-free quartz layer 60 which not only completely covers the planar exit side 52 but also extends across the cylindrical edge region 53. As a result, the substrate is also protected against immersion liquid which, promoted by capillary forces, might penetrate between the holder 54 and the last optical element. The coating method also enables an "all round protection" of the last optical element, it being possible to coat not only the exit side but also the edges and the entry side of the optical substrate with a coating acting as a barrier layer (cf. FIG. 5). Other coating methods, for example methods with physical vapor deposition (PVD), can also be used for reducing such all round coatings. If appropriate, through assistance by means of ion irradiation (IAD), the packing density of the layer material can be increased and the porosity can thus be reduced. Sputtering methods such as ion beam sputtering (IBS) or magnetron sputtering with an ion current that is less directional or concentrated in comparison with IBS can also be used for producing protective layer systems having a high packing density and low porosity.

Figure 3:
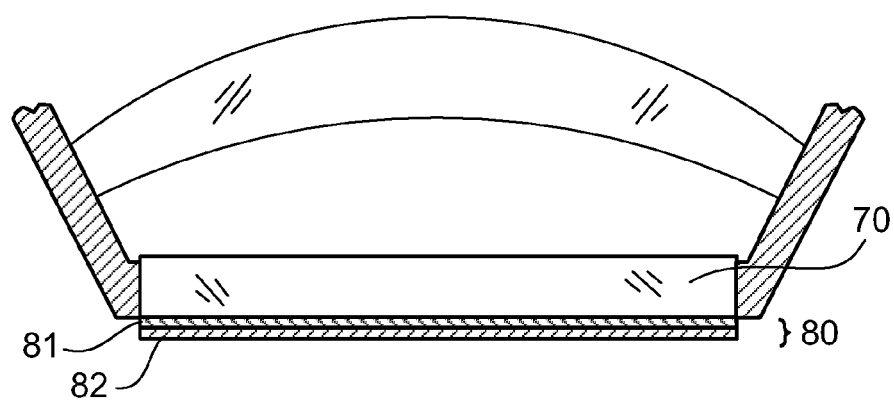
FIG. 3 shows an embodiment with a plate-type last element, in the case of which a two-layered protective layer is fitted.

In a method variant for producing a dense barrier layer, the protecting layer system is constructed in multilayer fashion with at least two partial coatings. In this respect, FIG. 3 shows, by way of example, a protective layer system 80 which is constructed from two single layers and is fitted to a last optical element in the form of a plane-parallel plate 70. If the surface of the coating is cleaned after application of the first layer 81 nearest the substrate and prior to application of the subsequent outer layer 82, then pores passing through from the outer side as far as the substrate can largely be avoided. As a result, it is possible to provide a liquidtight protective layer system even if the single layers 81, 82 by themselves in each case have a porosity that is insufficient for complete protection.

Figure 4:
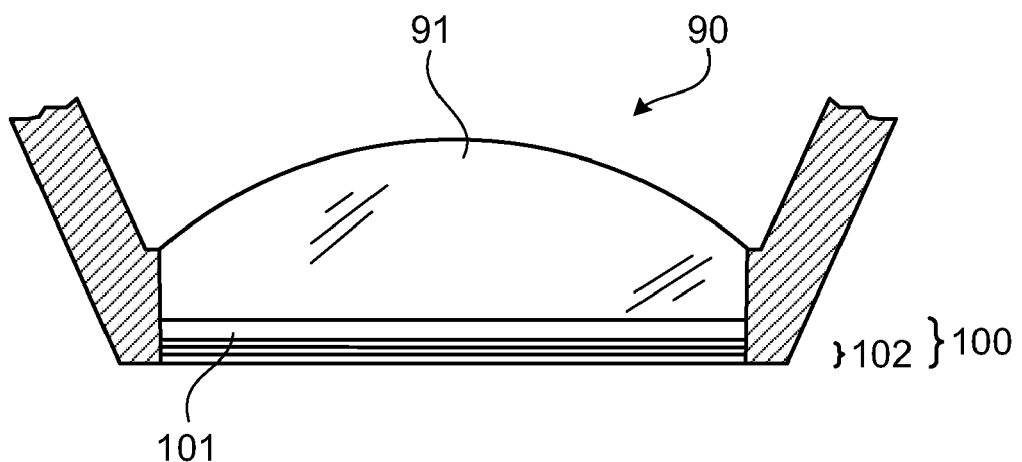
FIG. 4 shows an embodiment with a planoconvex lens, to the exit face of which a barrier layer and an outer multilayer antireflection coating are fitted.
Figure 5:
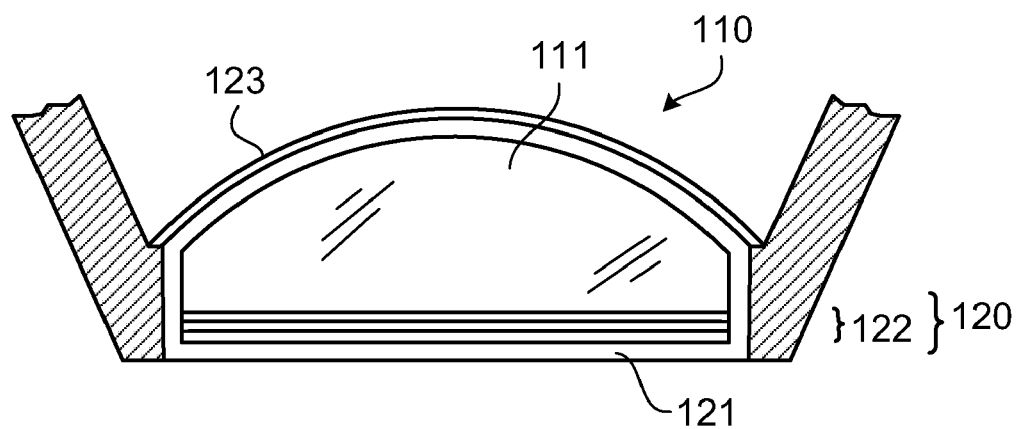
FIG. 5 shows an embodiment with a planoconvex lens, which is completely enclosed by a barrier layer.

FIGS. 4 and 5 show variants of protective layer systems in which the barrier effect blocking the ingress of immersion liquid is in each case provided by a single layer made of silicon dioxide applied in a PECVD method. In the case of the last optical element 90 in FIG. 4, a multilayer protective layer system 100 with a barrier effect is fitted to the exit side thereof. This system comprises a PECVD $SiO_2$ layer 101 applied directly to the transparent substrate, the thickness of which layer may lie between approximately 0.1 λ and approximately 0.6 λ, for example, depending on the embodiment. An alternating layer system 102 made of dielectric material alternately having a high refractive index and having a low refractive index is applied to the outer side of the barrier layer 101. The material having a high refractive index essentially consists of lanthanum fluoride in the exemplary case, while magnesium fluoride is used as the material having a low refractive index. The layer thickness of the $SiO_2$ barrier layer 101 and the layer thickness of the single layers of the alternating layer system 102 are adapted to one another in such a way that the entire protective layer system 100 serves as an antireflection coating.

Figure 6:
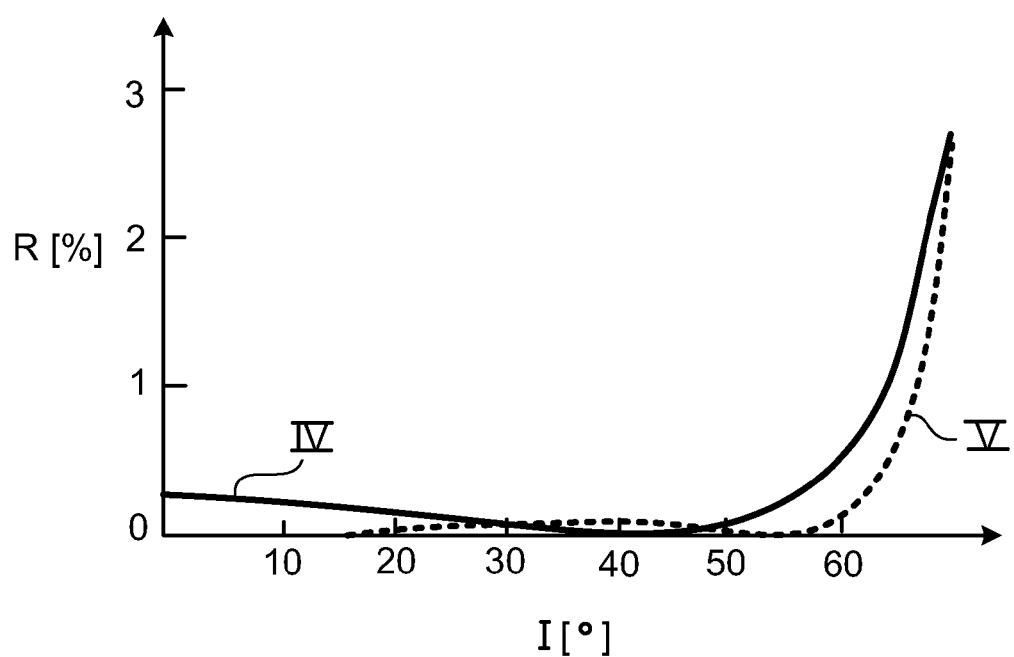
FIG. 6 shows a diagram showing the dependence of the degree of reflection R as a function of the angle of incidence I for the systems in FIG. 4 (curve IV) and FIG. 5 (curve V)

An exemplary system is specified in Table 1; the corresponding dependence of the degree of reflection R on the angle of incidence I with respect to water (n≈1.437) given a numerical aperture NA=1.25 (corresponding to I=60°) is shown by curve IV in FIG. 6. The degree of reflection lies below 0.5% in the entire angle of incidence range up to I=60°. Table 1 specifies the optical layer thicknesses of the single layers in fractions of the optical layer thickness $d_{QWOT}$ of a λ/4 layer of the corresponding material.

TABLE 1

| Layer | Material | $d_{QWOT}$ |
|---|---|---|
| Substrate | $CaF_2$ | |
| 1 | $SiO_2$ (PECVD) | 1.000 |
| 2 | $MFg_2$ | 0.627 |
| 3 | $LaF_3$ | 0.244 |
| 4 | $MgF_2$ | 1.739 |

Such a coating may be produced as follows: Firstly, the exit side of the substrate 91 which is to be coated is cleaned. The barrier layer 101 is then applied in pore-free fashion by means of PECVD. If appropriate, it is possible to carry out an optical measurement of the $SiO_2$ layer thickness and an adaptation of the thickness of the first layer to the subsequent antireflection design. Cleaning may optionally be carried out after the coating. The production of the alternating layer 102 is carried out at elevated temperature in a manner coordinated with the system calcium fluoride/PECVD $SiO_2$ layer. One advantage of this method implementation consists in the fact that the design of the alternating layer system 102 can be simply coordinated with the underlying system calcium fluoride/ PECVD $SiO_2$. In this way, a highly reflection-reducing effect can be produced even when the thickness reproducibility of the PECVD layer is not optimal. The design adaptation may be effected, if appropriate, after measurement of the actual thickness of the PECVD layer.

With a different method implementation, it is possible to produce a last optical element which is protected against immersion liquid and is fully antireflection-coated, said optical element being shown by way of example in FIG. 5. In this case, after the substrate 111 formed as a planoconvex lens had been cleaned, firstly a multilayer alternating layer system 122 was vapor-deposited onto its planar exit side, but without a last sublayer with respect to the outer area. Afterward, an essentially pore-free PECVD $SiO_2$ layer 121 enclosing the entire element and the alternating layer system and having an optical layer thickness of approximately λ/4 was applied in the PECVD method, said layer acting as a liquidtight barrier layer. In this case, the optical layer thickness is adapted to the alternating layer system 122 so as to result overall in a reflection-reducing effect (cf. curve V in FIG. 6). The spherical entry side was subsequently antireflection-coated with a single layer 123. One advantage of this method implementation consists in the fact that, on the outer side of the substrate 111 below the protective, pore-free PECVD $SiO_2$ layer, water-soluble or hydroscopic substances can also be used for the alternating layer system 122. An exemplary system having a degree of reflection R≦0.2% in the angle of incidence range of between 0° and 60° is specified in Table 2.

TABLE 2

| Layer | Material | $d_{QWOT}$ |
|---|---|---|
| Substrate | $CaF_2$ | |
| 1 | $LaF_3$ | 0.302 |
| 2 | $MgF_2$ | 0.279 |
| 3 | $LaF_3$ | 2.1401 |
| 4 | $SiO_2$ (PECVD) | 1.000 |

Figure 7:
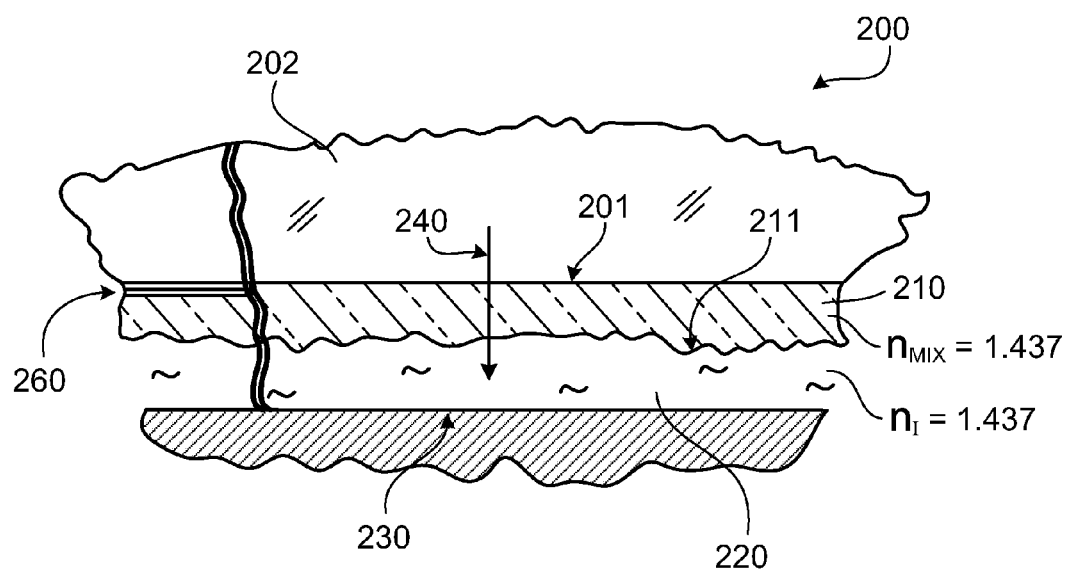
FIG. 7 shows an embodiment of a last optical element with a wear layer that is adapted in terms of refractive index and is made of mixed materials.

With reference to the embodiment shown schematically in FIG. 7, a description is given of another possibility for protecting a last optical element 200 of an immersion objective with the aid of a protective layer system against degradation of its optical properties on account of contact with an immersion medium. The protective layer system 210, which is fitted to the planar exit side 201 of a calcium fluoride substrate 202, is designed as an optically neutral wear layer or sacrificial layer which makes it possible for the more or less unavoidable surface damage due to attack by the immersion medium 220 to be rendered optically ineffective. In the embodiment, this is achieved by virtue of the fact that the protective layer 210 consists of a material whose refractive index $n_{MIX}$ essentially corresponds to the refractive index $n_I$ of the immersion medium. In such a case, the space between the exit side 201 of the substrate and the surface 230 of the wafer is filled with media having an identical refractive index. Therefore, the location at which the solid/liquid interface 211 between the exit side of the protective layer 210 and the immersion medium is situated and the surface form of this interface are unimportant for the optical effect. Therefore, a gradual dissolution of the protective layer material under the action of the immersion medium cannot impair the optical properties of the system.

In the exemplary case, water having a refractive index $n_I \approx 1.437$ at an operating wavelength of 193 nm is used as the immersion liquid 220. The material of the protective layer 210 is a mixed material in which magnesium fluoride having a low refractive index and lanthanum fluoride having a high refractive index are present in a mixture ration such that an average refractive index $n_{MIX} \approx 1.437$ is produced. The mixture layer 210 was produced as an essentially homogeneous mixed layer by simultaneous vaporization of magnesium fluoride and lanthanum fluoride. In other embodiments, the materials were alternately vapor-deposited in such a way as to produce a layer-patterned mixed material, the single layers in each case having a thickness of only a few nm, so that the transmitted light 240 "sees" only an average refractive index.

In order that the wear layer 210 acquires a service life that is as long as possible, the layer material was applied with ion assistance (ion assisted deposition, IAD) in the exemplary case, thereby producing a high packing density and low porosity. When calculating the mixture ratio of the two or more components of the mixed system, a possible residual porosity of the layer should be taken into account, which gradually becomes saturated with immersion liquid during operation, which contributes to the average refractive index of the layer in the pores with its refractive index $n_I$.

In an alternative embodiment, pure magnesium fluoride (refractive index $n \approx 1.44$ to 193 nm) is vapor-deposited as the wear layer. This also enables an adaptation of the refractive indices of wear layer and immersion medium which suffices in many cases. By controlling the compactness of the $MgF_2$ layer, the refractive index thereof can be controlled and adapted to the refractive index of ultrapure water at 193 nm. This is an alternative to a two-substance vapor deposition.

If required, a reflection-reducing antireflection layer 260 may additionally be inserted between the substrate 202 of the last optical element and the wear layer 210 (left-hand partial figure of FIG. 7).

Figure 8A:
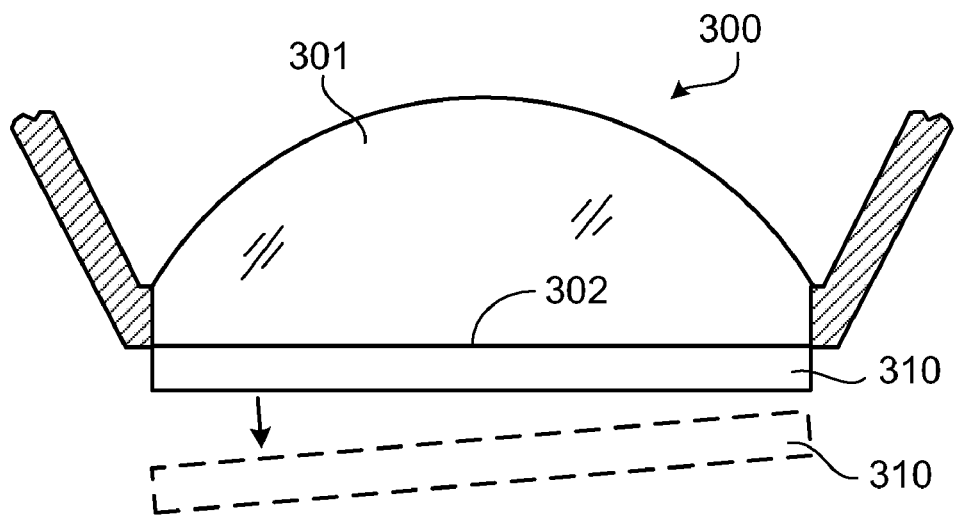
FIG. 8 shows exemplary embodiments of exchangeable protective layer systems, FIG. 8(a) schematically showing a protective plate wrung onto a planoconvex lens and FIG. 8(b) schematically showing a separately held, exchangeable protective plate.

FIG. 8(a) shows the exit-side end of another embodiment of an immersion objective, in which the last optical element 300 is a planoconvex lens. The latter is protected against attack by the immersion liquid by a protective layer system 310 in the form of a bulk material plate made of lithium fluoride (LiF). The index-matched plane-parallel plate 310 is wrung onto the planar exit side 302 of the calcium fluoride substrate 301, thereby producing an optically neutral, releasable connection. Accordingly, the plate 310 can be exchanged if required (detached plate depicted by broken lines).

The plate material lithium fluoride has a refractive index of approximately $n=1.443$ at an operating wavelength of 193 nm, with the result that there is only a refractive index difference of approximately $\Delta n=0.006$ with respect to the refractive index $n_I$ of the water used as immersion liquid ($n_I \approx 1.437$). The plate 310 may serve as a wear system since, owing to the small refractive index difference with respect to the immersion liquid, it is practically insignificant for the optical properties of the system if the material slowly dissolves during prolonged contact with the immersion liquid (cf. explanations referring to FIG. 7). Should it be necessary to exchange a wear plate after prolonged use, this is possible with little effort on account of the releasable connection to the substrate 310, without having to intervene in the objective construction.

Figure 8B:
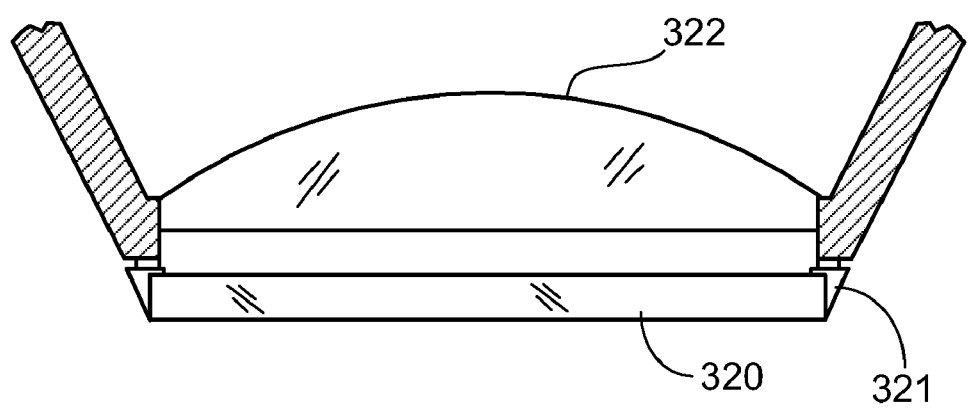

The embodiment in FIG. 8(b) is provided with a plate-type exchangeable wear element 320, which has a separate holder 321 in order to enable straightforward exchange. The protective layer system formed by the plate 320 is fitted at a distance from the last refractive optical element (planoconvex lens 322).

With the use of non-aqueous immersion fluids having a refractive index that is comparable to the refractive index of water but lower, an alternative material that is also appropriate is sodium fluoride (NaF), which has a refractive index of approximately $n=1.385$ at 193 nm. Sodium fluoride is readily soluble in water, but it is sufficiently resistant for fluorinated liquids. This approach may therefore be particularly expedient for 157 nm. It is possible to adapt the refractive index of a fluorinated medium to the refractive index of NaF or $CaF_2$.

Embodiments of protective layer systems that have an antireflection effect for the interface immersion liquid (in particular water)/substrate material of the last optical element (in particular calcium fluoride) have already been described in connection with FIGS. 1 to 6. An embodiment with an outstanding antireflection effect is explained in connection with FIGS. 9 and 10. In the case of the embodiments considered here, the protective layer system essentially consists of a graded index layer with a predeterminable refractive index profile perpendicular to the layer extent, that is to say essentially parallel to the transmission direction. In this case, it is possible to achieve a virtually ideal antireflection effect if a continuous or approximately continuous, virtually exponentially proceeding transition between the refractive index of the substrate material of the last optical element and the refractive index of the immersion medium takes place within the graded index layer. Such graded index layers are not practicable in conventional antiflection layer systems on lenses that are in contact with air or a different gas, since a refractive index in proximity to the refractive index of air ($n=1$) cannot be achieved with solid materials. However, the inventors have recognized that, in the case of immersion lithography, a medium having a high refractive index that adjoins the optical element, namely the immersion medium, can be used to achieve optimum antireflection coating.

Figure 9:
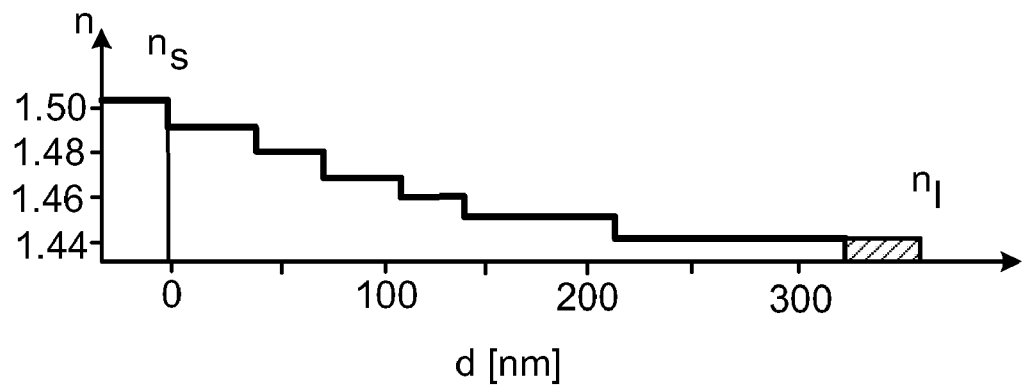
FIG. 9 shows a schematic diagram of the refractive index profile of the refractive index n as a function of the layer thickness d in a multilayer graded index layer.

The basic concept will be explained in greater detail using the exemplary case of water as immersion medium ($n_I \approx 1.437$ at 193 nm). There are materials which are suitable as layer material and have approximately this refractive index, for example magnesium fluoride ($n_I=1.44$). There are also materials available which have a lower refractive index, for example aluminum fluoride ($AlF_3$) where $n \approx 1.42$. The refractive index of the substrate material calcium fluoride, where $n \approx 1.51$ is higher than $n_I$. There are also materials available whose refractive index is greater than that of the substrate material, for example lanthanum fluoride ($LAf_3$) where approximately n=1.71. Given a suitable mixture ratio of lanthanum fluoride and magnesium fluoride, it is possible to produce a graded index layer which, in proximity to the substrate material, essentially has the refractive index of the substrate material and whose refractive index slowly decreases in the direction of the refractive index of the immersion medium with greater distance from the substrate by reducing the proportion of lanthanum fluoride and increasing the proportion of magnesium fluoride. In FIG. 9, by way of example, the refractive index profile in a multilayer system is plotted against the thickness d of the layer system, the average refractive index of successive layers decreasing in small steps from the substrate (refractive index $n_s$) to the immersion medium (refractive index $n_f$). A similar refractive index profile may also be realized by means of a sequence of very thin unalloyed lanthanum fluoride and magnesium fluoride single layers a few nm thick whose thickness ratio varies with distance from the substrate. In the selection of materials or material mixtures, those materials which are not water-soluble or only sparingly water-soluble should be selected.

Figure 10:
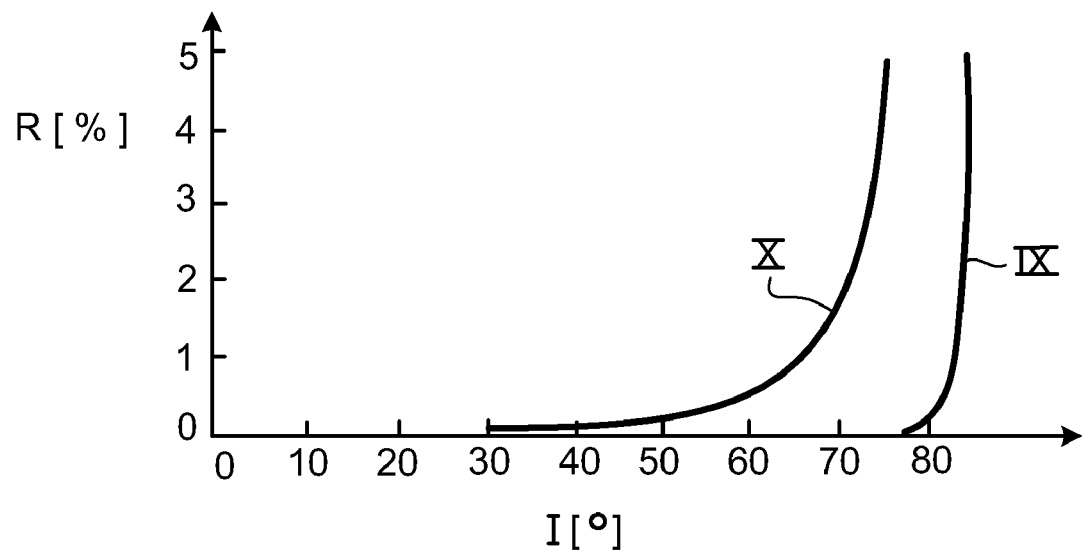
FIG. 10 shows a diagram showing the dependence of the degree of reflection R on the angle of incidence I, curve X showing the reflection profile of an uncoated calcium fluoride substrate and curve IX showing the reflection profile with an antireflection graded index layer in the case of measurement in water with light coming from the side of the water.

For the system illustrated in FIG. 9, FIG. 10 shows the dependence of the degree of reflection on the angle of incidence I (curve IX). In comparison with this, the curve X shows the reflection profile of an uncoated calcium fluoride substrate. The intense reflection-reducing effect of the graded index layer, which enables degrees of reflection of distinctly less than 0.1 for angles of incidence of up to almost 80°, is clearly discernible. The reflection-reducing effect becomes clear particularly at high angles of incidence above 50° or 60°.

An explanation has been given here, on the basis of a few examples, of how it is possible, by refractive index adaptation between the immersion liquid and the material adjoining the latter, to create protective layer systems whose optical properties are relatively insensitive to a chemical/physical attack by the immersion medium. In this case, a vanishing refractive index difference between the adjoining media at the solid/liquid interface is to be sought in the ideal case. If a sufficiently small refractive index difference cannot be obtained solely on the basis of the choice of material for the solid, it is also possible to modify the refractive index $n_f$ of the immersion medium by suitable additives. A practically vanishing refractive index difference is to be sought since very small irregularities in the rate of removal over the area cross section may impermissibly impair the imaging wavefront. Owing to the through-flow of the immersion medium, a nonuniform, nonequidistant removal can be avoided only with difficulty.

Figure 11:
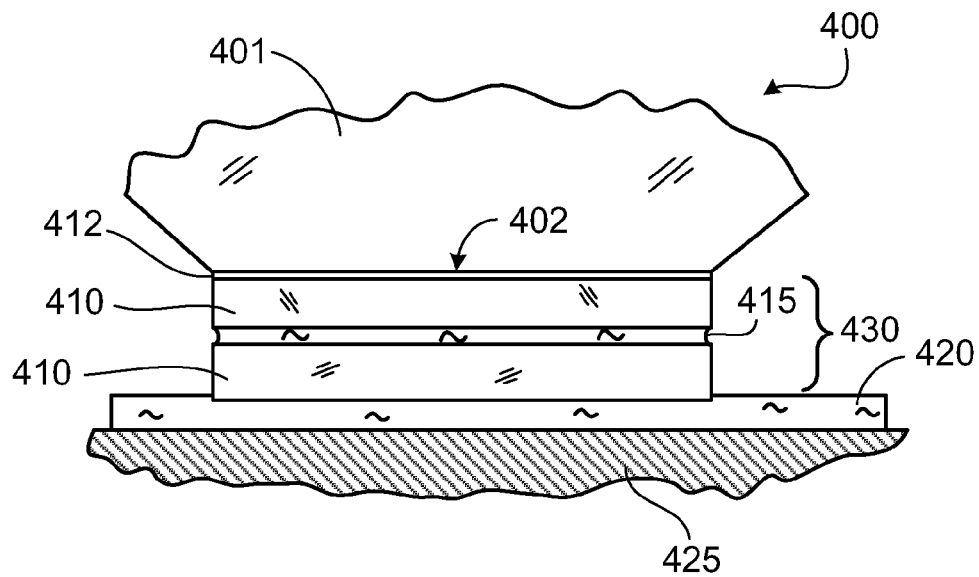
FIG. 11 shows a first embodiment using two layers with an immersion medium (double immersion)
Figure 12:
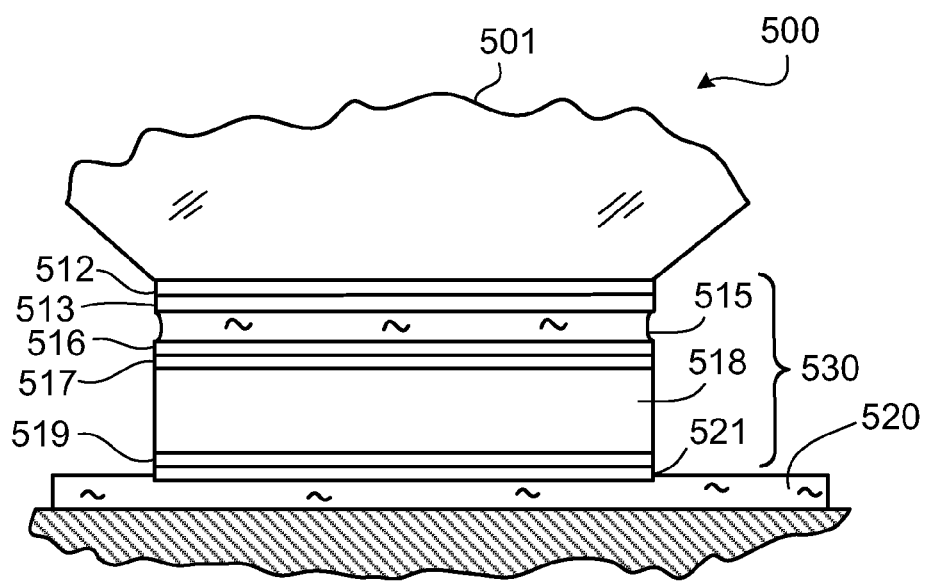
FIG. 12 shows a second embodiment using two layers with an immersion medium (double immersion).

With reference to FIGS. 11 and 12, an explanation is given of embodiments of the invention in which two layers of an immersion medium are situated between the last optical element and the surface to be exposed, in order to enable the projection objective to be optically coupled to the light-sensitive wafer surface and, at the same time, a simple exchange of parts which are possibly susceptible to wear. FIG. 11 shows a last optical element 400, in the case of which the substrate 401 is a planoconvex lens made of calcium fluoride (silicon dioxide in other embodiments). A plane-parallel plate 410 made of lithium fluoride is wrung onto the planar exit side 402 of the lens. In order to minimize reflections on account of the refractive index difference between calcium fluoride ($n_s$=1.502 at 193 nm) and lithium fluoride ($n_s$=1.443 at 193 nm), a $\lambda/4$ antireflection layer 412 is interposed between the substrate and the plate 410. A plane-parallel plate 418 made of lithium fluoride and serving as an exchangeable plate is optically and mechanically coupled to the plate 410 with the aid of a thin immersion layer 415 made of ultrapure water. The exchangeable plate 418 is in contact with the immersion medium 420 (ultrapure water), which fills the interspace between the projection objective and the wafer 425 to be exposed. The layers 412, 410, 415 and 418 form a protective layer system comprising a layer made of an immersion liquid. By virtue of the very small refractive index differences between the plates 410 and 418 and the intervening immersion layer 415, the plates and the layer act approximately like a single plane-parallel optical element. However, the intervening water film 415 permits the wear plate 418 to be exchanged in a manner that is simple and does not burden the rest of the system, should this be necessary after a certain operational duration. In other embodiments, the immersion layers 415 and 420 are formed on the opposite sides of the terminating plate 418 by means of different immersion media.

Another embodiment of a last optical element 500 with double immersion is shown with reference to FIG. 12. A planoconvex lens 501 made of calcium fluoride has optically coupled to it a plane-parallel exchangeable plate 518, likewise made of calcium fluoride. The optical coupling is effected by means of an immersion layer 515 made of water or heavy water which is kept in a closed system or a closed circuit in order to fill the space between the substrate 501 and the exchangeable plate 518. Fitted between the substrate 501 and the immersion layer 515 are $\lambda/4$ antireflection layer 512 and a wear layer 513, which adjoins the immersion medium and has a comparable refractive index. Toward the exchangeable plate 518 there follow a wear layer 506 and a $\lambda/4$ antireflection layer 517 adjoining the plate 518. The antireflection layers 512, 517 ensure a high transmission between the calcium fluoride (element 501 and 518) having a high refractive index (n=1.502) and the water film having a low refractive index (n=1.437). For this purpose, the refractive index of the antireflection layers may be approximately n=1.468. A further $\lambda/4$ antireflection layer and a wear layer 521 provided for contact with the immersion medium 520 are fitted to the wafer-side exit side of the plate 518. The exchangeable plate 518 which is antireflection-coated on both sides and protected against attack by water can easily be exchanged should this be necessary after prolonged use. The protective layer system 530 in this case comprises eight layers, also including one immersion layer 515. The immersion layer 515 may be formed by a different immersion medium than the immersion layer 520 on the opposite side of the coated termination plate 518.

When using customary standard coating techniques in the production of protective layer systems, it is not possible to preclude the presence of particles, for example polishing residues or dust, and/or scratches on the substrate surface to be protected prior to coating. In this case, there is the risk that a layer applied thereto, directly in the vicinity of these critical points, will not be able to totally seal the underlying substrate. By way of example, if calcium fluoride is used as substrate material and water is used as immersion liquid, then the calcium fluoride may be attacked at these locations and be dissolved in the water. As a result, these locations may be enlarged by the formation of etching pits, as a result of which wavefront deformations, scattered light and other faults that disturb the imaging may arise. The formation of such faults is avoided in the case of a particular method variant by virtue of the fact that after a first coating by which a first layer is applied to the substrate (or a coating applied thereto), a part of said first layer is polished away by means of a mechanical method. In this case, some of the particles are sheared off or torn out from the coated area and a polishing interface arises, which is smoother, that is to say has less roughness, than the surface of a conventional coating. After this step, the polishing surface is cleaned and coated a second time. In the course of this second coating, generally particles are admittedly present again on the surface, but they will not be at exactly the same positions as the particles present prior to the first coating. These method steps (coating-polishing-coating) are preferably repeated until it is ensured that each particle has been removed at least once. What can thereby be achieved is that the substrate is covered with an impermeable protective layer at every point, with the result that an attack by the immersion medium cannot occur and the long-term stability of the substrate material with respect to the immersion medium is thus ensured.

FIG. 13 shows a highly schematic, enlarged illustration of a last optical element 600 with a calcium fluoride substrate 601, the planar substrate surface 602 of which has been coated with a protective layer system 630 produced in this way. In the case of the example, the protective layer system 630 comprises a first layer 611 applied directly on the substrate and a second layer 612 applied to said first layer. Both layers consist of the same coating material. The interface 615 between the first and second layers is formed as an optically smooth polishing interface on account of the polishing step, the second layer 612 bearing on said polishing interface. Since the coating process was carried out in an atmosphere not totally free of particles, the particles have resulted in the formation of defects 621 within the first layer. Defects 622 may arise again during the production of the second layer 612 as well. However, since the first defects 621 of the first layer and the second defects 622 of the second layer are distributed at different lateral positions within the layers, a defect-free region exists in at least one layer of the protective multilayer system 630 at every location of the coated surface, so that overall the entire coated surface is covered with defect-free regions adjoining one another (which may lie in different layers of the multilayer system. With the use of a layer material that is chemically resistant to the immersion medium, it is thereby possible to produce a protective layer which effects complete sealing against the immersion medium and is essentially homogeneous from a chemical standpoint.

FIG. 14 shows a highly schematic, enlarged illustration of the image-side end region of a lithography objective with a last optical element 700 on the image side which has a calcium fluoride substrate 701 in the form of a planoconvex lens held in a holder element 750. A thin plate 730 made of synthetic quartz glass is wrung onto the planar substrate surface 702 facing the image plane. The thin quartz glass plate 730 acts as a protective layer system in order to protect the water-soluble substrate material calcium fluoride against chemical attack by the immersion liquid 720, which essentially consists of water and fills a narrow interspace between the image-side exit face of the protective plate 730 and the surface of a semiconductor wafer 725 that is coated with a light-sensitive layer. The uncoated protective plate 730 adheres to the planar substrate surface 702 solely by adhesion forces, thereby ensuring a large-area optical contact along a single interface. The thin quartz glass plate 730 (plate thickness approximately 1 mm) was postprocessed after wringing on the uncovered surface by ion beam sputtering in order to correct surface deformations that are possibly present by means of targeted local material removal.

In the holder element 750, fluid channels 751 are introduced in direct proximity to the optical element 700 and, during operation of the projection system, are connected to a temperature regulation device 760 which comprises a cooling unit in order to provide a cooling liquid having a temperature of approximately 10° C. which is conducted in a closed circuit through the cooling channels 751. A temperature regulation device 770 for the immersion medium 720 ensures that the latter is likewise kept at a temperature of approximately 10° C. The active cooling both of the last optical element and of the immersion medium makes it possible to reduce temperature fluctuations to values significantly below 1 K, so that thermally induced stresses between substrate 701 and wrung protection plate 730 can be reduced to harmless values. The temperature regulation device 760 is activated as required immediately after the wringing of the protective plate 730 and will also be operational during the transport of the projection objective between production site and site of use and also during the construction of the projection exposure apparatus in order to maintain a largely constant temperature of the lower region of the objective and especially of the last optical element in order to avoid detachment of the two parts on account of thermally induced stresses.

In another embodiment (not shown), the wrung plate 730 consists of barium fluoride, which, in comparison with the substrate 701 which likewise consists of fluoride crystal material, has a significantly smaller difference in the coefficient of thermal expansion than quartz glass, so that the risk of thermally induced stresses and associated detachment of the protective plate is reduced or avoided already on account of the very similar coefficients of thermal expansion of substrate material and plate material.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. A projection objective for imaging a pattern arranged in an object plane of the projection objective into an image plane of the projection objective, the projection objective comprising:
   an optical element, comprising:
      a transparent substrate; and
      at least one barrier layer comprising a perfluorinated hydrocarbon supported by the transparent substrate; and
   an immersion medium arranged between the optical element of the projection objective and the image plane,
   wherein the at least one barrier layer is in contact with the immersion medium and is capable of reducing degradation of the transparent substrate caused by the immersion medium.

2. The projection objective as claimed in claim 1, wherein the perfluorinated hydrocarbon comprises polytetrafluoroethylene.

3. The projection objective as claimed in claim 1, wherein the immersion medium comprises water.

* * * * *

UNITED STATES PATENT AND TRADEMARK OFFICE
CERTIFICATE OF CORRECTION

PATENT NO. : 7,460,206 B2 Page 1 of 1
APPLICATION NO. : 11/015553
DATED : December 2, 2008
INVENTOR(S) : Karl-Stefan Weissenrieder et al.

It is certified that error appears in the above-identified patent and that said Letters Patent is hereby corrected as shown below:

Title Pg, Item (75) Inventors: (second inventor), delete "Ellwangen" insert --Oberkochen--.

Title Pg, Item (56) Ref Cited: Page 3, Column 2 (Other Publications), delete "0.2μM" insert --0.2μm--.

Column 1, line 3, insert subheading --CROSS-REFERENCE TO RELATED APPLICATIONS--.

Column 1, before line 14, insert subheading --FIELD OF THE INVENTION--.

Column 1, before line 19, insert subheading --BACKGROUND OF THE INVENTION--.

Column 1, before line 24, insert subheading --SUMMARY OF THE INVENTION--.

Column 11, before line 34, insert subheading --BRIEF DESCRIPTION OF THE DRAWINGS--.

Column 12, before line 18, insert subheading --DETAILED DESCRIPTION OF THE DRAWINGS--.

Column 12, line 61, delete "liquid-tight" insert --liquidtight--.

Column 19, line 2, delete "(LAf$_3$)" insert --(LaF$_3$)--.

Signed and Sealed this

Seventeenth Day of February, 2009

JOHN DOLL
*Acting Director of the United States Patent and Trademark Office*